(12) United States Patent
Cook et al.

(10) Patent No.: US 9,054,793 B2
(45) Date of Patent: Jun. 9, 2015

(54) STRUCTURE, SYSTEM AND METHOD FOR DEVICE RADIO FREQUENCY (RF) RELIABILITY

(71) Applicant: International Business Machines Corporation, Armonk, NY (US)

(72) Inventors: Donald J. Cook, Essex Junction, VT (US); Hanyi Ding, Colchester, VT (US); Xuefeng Liu, South Burlington, VT (US); Randy L. Wolf, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 13/945,969

(22) Filed: Jul. 19, 2013

(65) Prior Publication Data

US 2015/0024693 A1    Jan. 22, 2015

(51) Int. Cl.
*H04B 17/00* (2006.01)
*H03C 1/62* (2006.01)

(52) U.S. Cl.
CPC ..................... *H04B 17/00* (2013.01)

(58) Field of Classification Search
CPC ............. H04B 17/002; H04B 17/0017; H04B 17/0027; H04B 17/0085; H04B 17/00; H04B 17/16; H04B 17/19
USPC ............. 455/67.11, 67.14–67.7, 115.1–115.4
See application file for complete search history.

(56) References Cited

U.S. PATENT DOCUMENTS

| | | | |
|---|---|---|---|
| 5,404,109 A | 4/1995 | Pribble et al. | |
| 5,905,384 A | 5/1999 | Inoue et al. | |
| 6,194,739 B1 * | 2/2001 | Ivanov et al. | 257/48 |
| 6,396,298 B1 | 5/2002 | Young et al. | |
| 6,541,993 B2 | 4/2003 | Laureanti | |
| 6,963,215 B1 | 11/2005 | Mastrapasqua | |
| 7,102,358 B2 | 9/2006 | Keshavarzi et al. | |
| 7,756,663 B2 | 7/2010 | Han et al. | |
| 7,808,266 B2 | 10/2010 | Marsall et al. | |
| 7,898,277 B2 | 3/2011 | Weir | |
| 7,952,378 B2 | 5/2011 | Marshall et al. | |
| 8,283,941 B2 | 10/2012 | Kuo et al. | |

(Continued)

OTHER PUBLICATIONS

Scholten, et al., "The Relation Between Degradation Under DC and RF Stress Conditions," IEEE Transactions on Electron Devices, Mar. 18, 2011, pp. 1-8.

Liu, et al, "DC and RF Degradation Induced by High RF Power Stresses in 0.18-um nMOSFETs," IEEE Transactions on Device and Materials Reliability, vol. 10, No. 3, Sep. 2010, pp. 317-323.

(Continued)

*Primary Examiner* — Simon Nguyen
(74) *Attorney, Agent, or Firm* — Gibb & Riley, LLC; Michael J. LeStrange, Esq.

(57) ABSTRACT

Disclosed are test structures for radio frequency (RF) power stress and characterization. Each test structure incorporates a single device and is selectively operated in either a stress mode, during which the device is stressed under RF power, or in an analysis mode, during which the impact of the applied stress on the performance of the device is characterized. During the stress mode, an input RF power signal is applied to the device through an RF signal input port and an output RF power signal is captured from the device at an RF signal output port. Depending upon the impedance value of the device at issue, the RF signal input port and the RF signal output port are connected to either the same terminal or opposing terminals and the need for impedance tuning is avoided. Also disclosed are test systems and methods for selectively controlling operation of such a test structure.

20 Claims, 12 Drawing Sheets

(56) References Cited

U.S. PATENT DOCUMENTS

| | | | |
|---|---|---|---|
| 2006/0160505 A1* | 7/2006 | Ichitsubo et al. | 455/127.1 |
| 2007/0126446 A1* | 6/2007 | Szmyd | 324/760 |
| 2007/0159205 A1* | 7/2007 | Grund | 324/765 |
| 2011/0037494 A1* | 2/2011 | Hung et al. | 324/762.03 |
| 2013/0093451 A1* | 4/2013 | Cho | 324/756.01 |
| 2013/0200908 A1* | 8/2013 | Huebschman | 324/750.01 |
| 2014/0184258 A1* | 7/2014 | Ding et al. | 324/754.03 |
| 2014/0292364 A1* | 10/2014 | Chang et al. | 324/755.01 |
| 2014/0302797 A1* | 10/2014 | Han et al. | 455/67.14 |

OTHER PUBLICATIONS

Stephens, et al., "RF Reliability of Short Channel NMOS Devices," IEEE Radio Frequency Integrated Circuits Symposium, 2009, pp. 343-346.

Naseh, et al., "RF CMOS Reliability," International Journal of High Speed Electronics and Systems, vol. 11, No. 4, 2001, pp. 1249-1295.

Sasse, et al., "MOSFET Degradation Under RF Stress," IEEE Transactions on Electron Devices, vol. 55, No. 11, Nov. 2008, pp. 3167-3174.

* cited by examiner

US 9,054,793 B2

STRUCTURE, SYSTEM AND METHOD FOR DEVICE RADIO FREQUENCY (RF) RELIABILITY

BACKGROUND

The present disclosure relates to integrated circuit device reliability in radio frequency (RF) applications and, more specifically, to a structure, system and method for stressing and characterizing integrated circuit devices to be used in RF applications. Typically, reliability data for integrated circuit devices (e.g., field effect transistors (FETs), resistors, capacitors, etc.) is captured under direct current (DC) conditions and used to make accurate useful life predictions for both DC applications and digital applications. However, such DC reliability data (i.e., reliability data captured under DC conditions) is not sufficient for making useful life predictions when the integrated circuit devices are to be used in RF applications. For example, in an RF application, the RF swing voltage may exceed the maximum allowable DC bias voltage for a given device and can change the degradation of the given device due to various different failure mechanisms (e.g., hot carrier degradation, time-dependent dielectric breakdown, etc.) so as to change the useful life of the given device and, thereby the useful life of any integrated circuit structure that incorporates it. In order to understand the failure mechanisms and, thereby predict the useful life of an integrated circuit device in an RF application, a test structure must be deployed and stressed under RF power. Several prior art techniques have been proposed for stressing and characterizing an integrated circuit device under RF power, but these techniques do not separate particular failure mechanisms, do not account for impedance mismatch, and/or, if they do account for impedance mismatch, require complicated impedance tuning processes in order to avoid impedance mismatch. Thus, there is a need in the art for improved structures, systems and methods for stressing and characterizing integrated circuit devices to be used in RF applications.

SUMMARY

In view of the foregoing, disclosed herein are improved test structures for radio frequency (RF) power stressing and characterization. Each test structure can incorporate a single integrated circuit device (e.g., a field effect transistor, a resistor, a capacitor, etc.) and can be selectively operated in either a stress mode, during which the device is stressed under RF power and/or DC plus RF power, or in an analysis mode, during which the impact of the RF power stress on the performance of the device can be characterized. Specifically, during the stress mode, an input RF power signal is applied to the device through an RF signal input port and an output RF power signal is captured from the device at an RF signal output port. However, depending upon the impedance value of the integrated circuit device at issue, the RF signal input port and the RF signal output port can be either connected to the same terminal or connected to opposing terminals. For example, in a test structure with an integrated circuit device having a relatively high impedance value (e.g., a field effect transistor in an off-state, a low capacitance capacitor, high resistance resistor, etc.), the RF signal input port and the RF signal output port can be electrically connected to the same terminal, thereby avoiding any impedance mismatch. In a test structure with an integrated circuit device having a relatively low impedance value (e.g., a field effect transistor in an on-state, a high capacitance capacitor, a low resistance resistor, etc.), two opposing terminals can be connected to the RF signal input port and the RF signal output port, respectively, because impedance mismatch is not an issue. Such test structures have the added advantage of enabling the characterization to be performed with regard to a particular failure mechanism. Also disclosed herein are associated test systems and methods for selectively controlling operation of a test structure in different modes (i.e., in a stress mode and an analysis mode) in order to characterize the impact of RF power stress on an integrated circuit device contained therein.

More particularly, disclosed herein are test structures for RF power stressing and characterization. Each of the test structures can comprise an integrated circuit device (e.g., a field effect transistor, a resistor or a capacitor). This integrated circuit device can comprise multiple terminals including, but not limited to, a first terminal and a second terminal opposite the first terminal. The test structure can further comprise a first ground-signal-ground (GSG) pad set comprising a first signal pad (also referred to herein as an RF signal input port) between two first ground signal pads. The first signal pad can be electrically connected to the first terminal. The test structure can further comprise a second ground-signal-ground (GSG) pad set comprising a second signal pad (also referred to herein as an RF signal output port) between two second ground pads. The second signal pad can be electrically connected to either the first terminal or the second terminal, depending upon whether the integrated circuit device has a relatively high impedance value or relatively low impedance value between the said first and second terminals, respectively.

Specifically, in one test structure disclosed herein, the integrated circuit device can have a relatively high impedance value between the said first and second terminals. For example, the integrated circuit device can comprise a field effect transistor in an off-state, a resistor with a relatively high resistance, or a capacitor with a relatively low capacitance. In this case, the first signal pad (i.e., the RF signal input port) of the first GSG pad set and the second signal pad (i.e., the RF signal output port) of the second GSG pad can each be electrically to the same terminal of the integrated circuit device (e.g., to the first terminal).

In another test structure disclosed herein, the integrated circuit device can have a relatively low impedance value between the said first and second terminals. For example, the integrated circuit device can comprise a field effect transistor in an on-state, a resistor with a relatively low resistance or a capacitor with a relatively high capacitance. In this case, the first signal pad (i.e., the RF signal input port) of the first GSG pad set can be electrically connected to the first terminal and the second signal pad (i.e., the RF signal output port) of the second GSG pad set can be electrically connected to the second terminal.

In any case, the test structure can be selectively operable in either a stress mode or an analysis mode. In the stress mode, the first signal pad (and, thereby the first terminal) can receive an input RF power signal (e.g., from an RF signal generator), the second signal pad can output an output RF power signal (i.e., the second signal pad can receive an output RF power signal from either the first terminal or second terminal, as applicable, and can output that output RF power signal) and an RF open-circuit can be established between any one or more of the terminals and a direct current (DC) power supply. For purposes of this disclosure an RF open-circuit refers to a circuit showing high impedance to RF signal so that there is no RF current flow into the circuit. In the analysis mode, the impact of the applied RF power stress on the integrated circuit device can be characterized and, more specifically, a particular failure mechanism exhibited by the integrated circuit device can be characterized.

Also disclosed herein is a test system for selectively controlling operation of a test structure in different modes (i.e., in a stress mode and in an analysis mode) and providing required terminations (i.e. 50 ohms to some terminals and RF open-circuits for other terminals) in order to characterize the impact of radio frequency (RF) power stress (or, optionally, a combination of direct current (DC) power stress and RF power stress) on an integrated circuit device contained therein. Specifically, this test system can comprise any one of the above-described test structures and an RF signal generator, a network analyzer, and a direct current (DC) power supply each electrically connected to that test structure. The test system can further comprise a controller operatively connected to and controlling the RF signal generator, the network analyzer, the DC power supply and a characterization tool in order to selectively operate the test structure in a stress mode in order to subject the integrated circuit device to RF power stress (or, optionally, a combination of DC power stress plus RF power stress) and in an analysis mode in order to characterize the impact of such stress on the integrated circuit device. It should be noted that the characterization tool can comprise a component of the controller or, alternatively, can comprise a discrete component of the test system in communication with the controller.

Specifically, the controller can control the RF signal generator, the network analyzer and the DC power supply, during the stress mode, such that an RF open-circuit is established between one or more of the multiple terminals and the DC power supply for required DC bias conditions, such that the first signal pad and, thereby the first terminal receives an input RF power signal from the RF signal generator and such that the second signal pad outputs an output RF power signal (i.e., the second signal pad receives an output RF power signal from either the first terminal or second terminal, as applicable, and outputs that output RF power signal). The controller can further control the RF signal generator, the network analyzer and the DC power supply, during the analysis mode, in order to perform performance testing of the integrated circuit device (e.g., direct current (DC) sweep testing and/or S-parameter testing). The characterization tool can further characterize the impact of the RF power stress on the performance of the integrated circuit device and, more specifically, can characterize a particular failure mechanism exhibited by the integrated circuit device, based on the results of such performance testing.

Also disclosed herein is a test method for selectively controlling operation of a test structure in different modes (i.e., in a stress mode and an analysis mode) in order to characterize the impact of radio frequency (RF) power stress (or, optionally, a combination of direct current (DC) power stress and RF power stress) on an integrated circuit device contained therein. This test method can comprise forming any one of the different test structures, as described above, on a wafer. The method can further comprise selectively operating the test structure in either a stress mode in order to subject the integrated circuit device to RF power stress (or, optionally, in order to subject the integrated circuit device to a combination of DC power stress plus RF power stress) or an analysis mode in order to characterize the impact of the such stress on the integrated circuit device.

Specifically, during the stress mode, an RF open-circuit can be established between one or more of the multiple terminals and the DC power supply. Additionally, the first signal pad and, thereby the first terminal can receive an input RF power signal (e.g., from an RF signal generator). Then, the second signal pad can output an output RF power signal. That is, the second signal pad can receive an output RF power signal from either the first terminal or second terminal, as applicable, and can output that output RF power signal. During the analysis mode, performance testing of the integrated circuit device (e.g., DC sweep testing and/or S-parameter testing) can be performed and, based on the results of such performance testing, the impact of the RF power stress on the performance of the integrated circuit device can be characterized and, more specifically, a particular failure mechanism exhibited by the integrated circuit device can be characterized.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
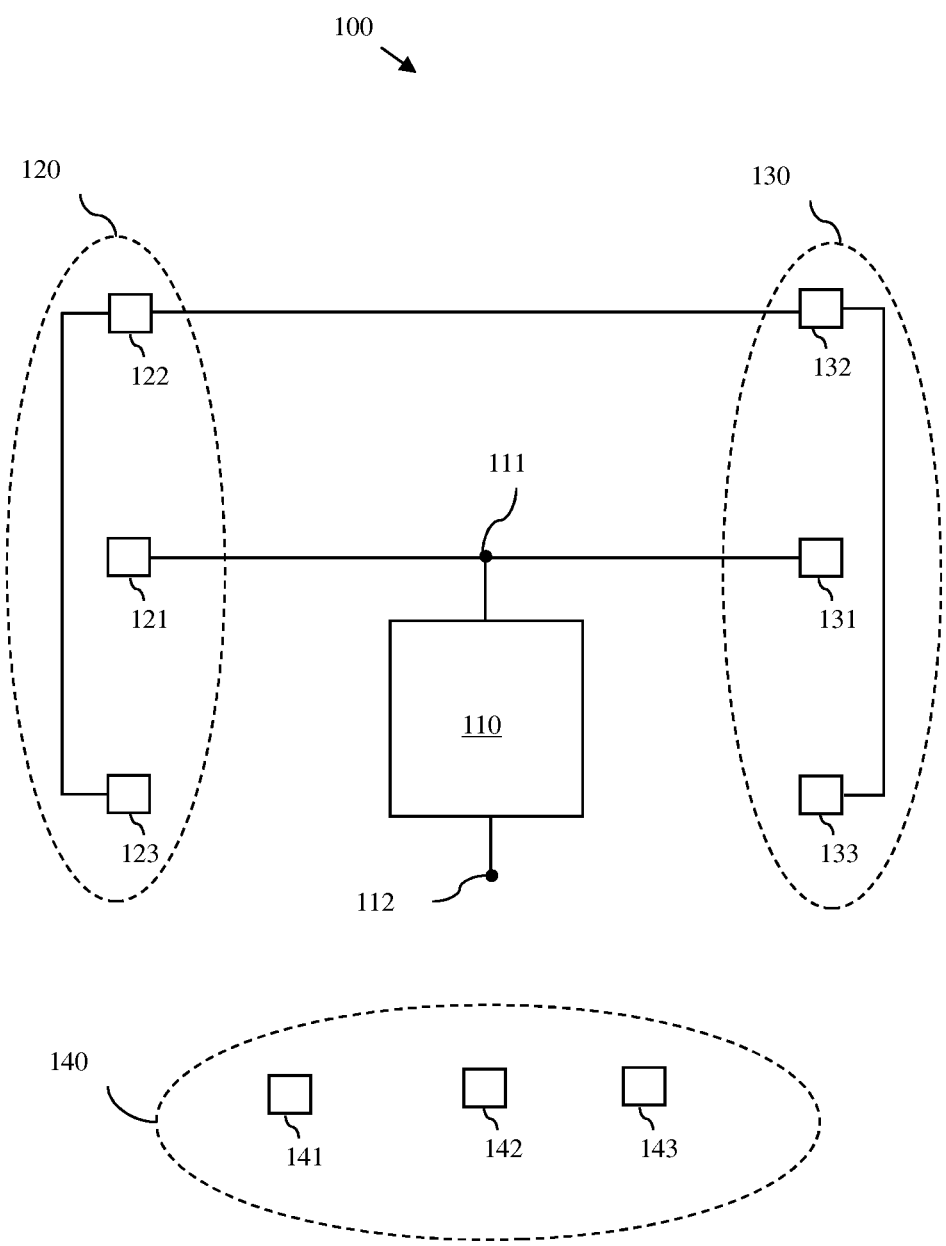
FIG. 1 is a schematic diagram illustrating a test structure.

As mentioned above, typically, reliability data for integrated circuit devices (e.g., field effect transistors (FETs), resistors, capacitors, etc.) reliabilities is captured under direct current (DC) conditions and used to make useful life predictions for both DC applications and digital applications. However, such DC reliability data (i.e., reliability data captured under DC conditions) is not sufficient for making useful life predictions when the integrated circuit devices are to be used in radio frequency (RF) applications. For example, in an RF application, the RF swing voltage may exceed the maximum allowable DC bias voltage for a given device and can change the degradation of the given device due to various different failure mechanisms (e.g., hot carrier degradation, time-dependent dielectric breakdown, etc.) so as to change the useful life of the given device and, thereby the useful life any integrated circuit structure that incorporates it. In order to understand the failure mechanisms and, thereby predict the useful life of an integrated circuit device in an RF application, a test structure must be deployed and stressed under RF power.

Several prior art techniques have been proposed for stressing and characterizing an integrated circuit device stressed under RF power, but these techniques do not separate particular failure mechanisms, do not account for impedance mismatch, and/or, if they do account for impedance mismatch, require complicated impedance tuning processes in order to avoid impedance mismatch. Thus, there is a need in the art for improved structures and systems for stressing and characterizing integrated circuit devices to be used in RF applications.

In view of the foregoing, disclosed herein are improved test structures for radio frequency (RF) power stressing and characterization. Each test structure can incorporate a single integrated circuit device (e.g., a field effect transistor, a resistor, a capacitor, etc.) and can be selectively operated in either a stress mode, during which the device is stressed under RF power or DC plus RF power, or in an analysis mode, during which the impact of the RF power stress or DC plus RF power stress on the performance of the device can be characterized. Specifically, during the stress mode, an input RF power signal is applied to the device through an RF signal input port and an output RF power signal is captured from the device at an RF signal output port. However, depending upon the impedance value of the integrated circuit device at issue, the RF signal input port and the RF signal output port can be either connected to the same terminal or connected to opposing terminals. For example, in a test structure with an integrated circuit device having a relatively high impedance value (e.g., a field effect transistor in an off-state, a low capacitance capacitor, high resistance resistor, etc.), the RF signal input port and the RF signal output port can be electrically connected to the same terminal, thereby avoiding any impedance mismatch. In a test structure with an integrated circuit device having a relatively low impedance value (e.g., a field effect transistor in an on-state, a high capacitance capacitor, a low resistance resistor, etc.), two opposing terminals can be connected to the RF signal input port and the RF signal output port, respectively, because impedance mismatch is not an issue. Such test structures have the added advantage of enabling the characterization to be performed with regard to a particular failure mechanism. Also disclosed herein are associated test systems and methods for selectively controlling operation of a test structure in different modes (i.e., in a stress mode and an analysis mode) in order to characterize the impact of RF power stress on an integrated circuit device contained therein.

Figure 2:
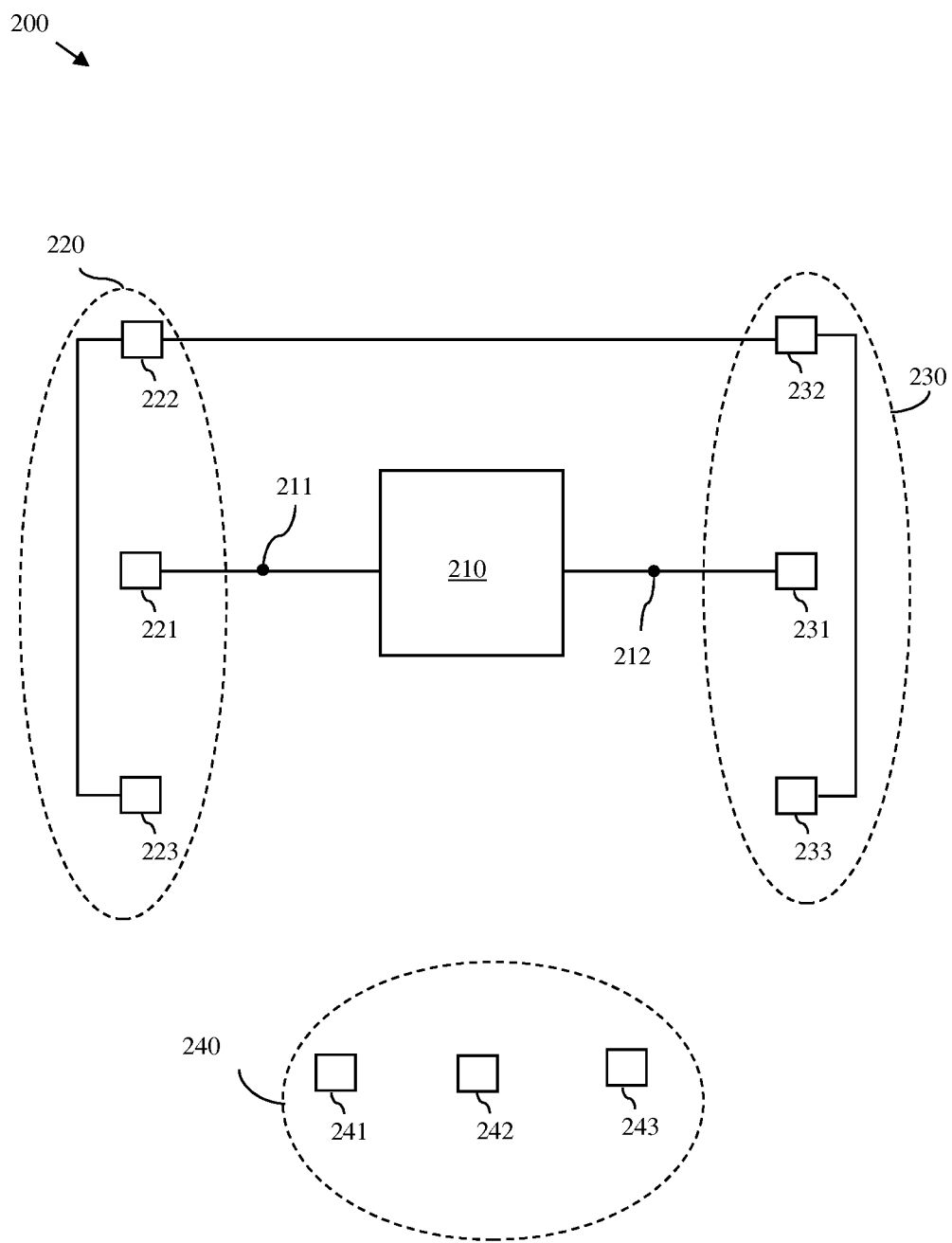
FIG. 2 is a schematic diagram illustrating another test structure.

Referring to FIGS. 1 and 2, disclosed herein are test structures 100, 200, respectively. Such test structures 100, 200 can be formed on a semiconductor wafer within an integrated circuit chip region (i.e., as an on-chip test structure). Alternatively, such test structures 100, 200 can be formed on a semiconductor wafer within a kerf region (i.e., in a region between functional integrated circuit chip regions on the semiconductor wafer, in a region separating the integrated circuit chip regions on a semiconductor wafer, etc.) with pad re-arrangement.

Generally, the test structures 100, 200 can each comprise an integrated circuit device 110, 210. As discussed in greater detail below, this integrated circuit device 110, 210 can comprise a multi-terminal integrated circuit device such as a field effect transistor, a resistor, a capacitor, or any other suitable multi-terminal semiconductor device. In any case, the integrated circuit device 110, 210 can comprise at least a first terminal 111, 211 and a second terminal 112, 212 opposite the first terminal 111, 211.

The test structures 100, 200 can each further comprise multiple conductive pad sets. The conductive pad sets can comprise, for example, two ground-signal-ground (GSG) pad sets comprising a first GSG pad set 120, 220 with two first ground pads 122-123, 222-223 and a first signal pad 121, 221 (also referred to herein as a RF signal input port) positioned laterally between the two first ground pads and a second GSG pad set 130, 230 with two second ground pads 132-133, 232-233 and a second signal pad (also referred to herein as a RF signal output port) positioned laterally between the two second grounds pads. The first and second GSG pad sets can be used, as necessary, to electrically connect the multiple terminals of the integrated circuit device 110, 210 to ground, to a RF signal generator or to some other device, as discussed in greater detail below. The conductive pad sets can also comprise a DC bias pad set 140, 240 comprising one or more DC bias pads 141-143, 241-243, which can be used to electrically connect one or more of the multiple terminals of the integrated circuit device 110, 210 to a direct current (DC) power supply, as discussed in greater detail below.

In any case, the first signal pad 121, 221 (i.e., the RF signal input port) of the first GSG pad set 120, 220 can be electrically connected to the first terminal 111, 121 of the integrated circuit device 110, 210. However, depending upon whether the integrated circuit device 110, 210 has a relatively high impedance value or a relatively low impedance value, the second signal pad 131, 231 (i.e., the RF signal output port) of the second GSG pad set 130, 230 can be electrically connected either to the first terminal 111 (e.g., as in the test structure 100 of FIG. 1) or to the second terminal 212 (as in the test structure 200 of FIG. 2).

Such test structures 100, 200 can be selectively operated in either a stress mode, during which the integrated circuit device 110, 210 can be stressed under RF power (or, optionally, under a combination of DC power plus RF power), or in an analysis mode, during which the impact of such stress on the performance of the integrated circuit device 110, 210 can be characterized. Specifically, in the stress mode, an RF open-circuit can be established between any one or more of the terminals (as a function of the type of integrated circuit device under test and the test structure configuration, see more detailed discussions below) and a DC power supply (not shown). For purposes of this disclosure an RF open-circuit refers to a circuit showing high impedance to RF signal so that there is no RF current flow into the circuit. Additionally, the first signal pad 121, 221 can receive an RF power signal (e.g., from an RF signal generator) and the second signal pad 131, 231 can receive an output RF power signal (e.g., from the first terminal 111 or the second terminal 212, as applicable). Application of the RF power signal to the integrated circuit device 110, 210 in this manner effectively stresses the integrated circuit device under RF power conditions. In the analysis mode, the integrated circuit device 110, 210 can be performance tested and the impact of the applied RF power stress can be characterized based on the results. Depending upon the type of integrated circuit device and the test structure configuration, this characterization can be directed to a specific-type of failure mechanism (e.g., hot carrier injection and time-dependent dielectric breakdown (TDDB) in the case of field effect transistors, resistance shifts and/or faults in the case of resistors, current leakage and dielectric breakdown in the case of capacitors, etc.).

FIGS. 3-6 are more detailed schematic diagrams illustrating various different configurations 100A-100D, respectively, for the test structure 100. These different configurations 100A-100D vary with regard to type of integrated circuit device 110 under test and/or the type of failure mechanism to be characterized.

Figure 3:
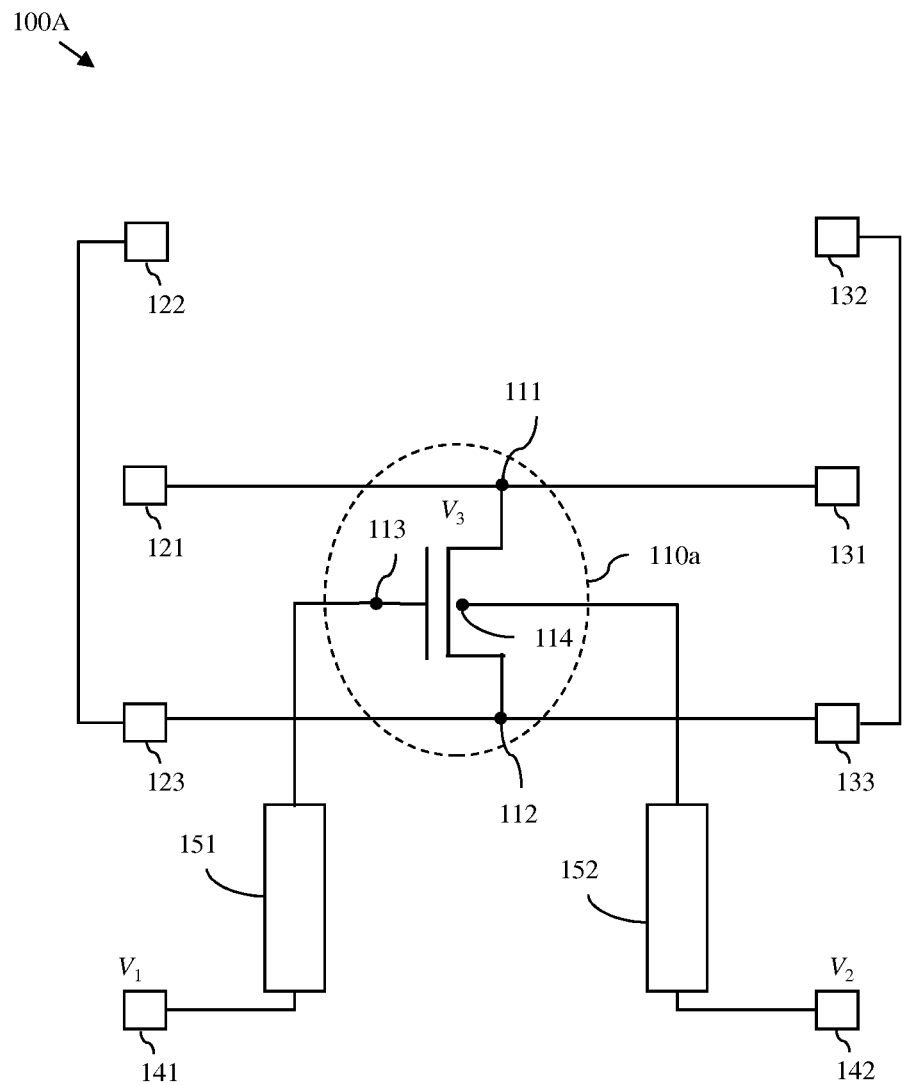
FIG. 3 is a schematic diagram illustrating the test structure of FIG. 1 incorporating a field effect transistor in an off-state.

For example, FIG. 3 is a schematic diagram illustrating an exemplary test structure 100A, wherein the integrated circuit device specifically comprises a field effect transistor 110a in an off-state (i.e., in a non-conducting state) such that resistance across the field effect transistor 110a (i.e., across the channel region between the source and drain regions) is relatively high. As a result, impedance will also be relatively high. Specifically, those skilled in the art will recognize that impedance is a complex value equal to the sum of both a real part and, particularly, resistance and an imaginary part and, particularly, reactance. Consequently, a field effect transistor 110a that is in an off-state (i.e., a non-conducting state) and, thereby exhibits relatively high resistance, will also exhibit relatively high impedance (e.g., an impedance value that is, for example, at least 5-10 times greater than 50 ohms, greater than 250 ohms, etc.). Those skilled in the art will recognize that 50 ohms is the typical port impedance of test equipment used in the art and is, thus, the standard impedance value used for impedance matching.

In this test structure 100A, the field effect transistor 110a can comprise a first terminal 111, a second terminal 112 opposite the first terminal 111, a third terminal 113 and a fourth terminal 114 opposite the third terminal 113. The first terminal 111 can comprise a drain (or source), the second terminal 112 can comprise a source opposite the drain (i.e., separated from the drain by a channel), the third terminal 113 can comprise a gate and the fourth terminal 114 can comprise a body or an additional gate opposite the gate. The first signal pad 121 (i.e., the RF signal input port) can be electrically connected to the first terminal 111 (i.e., the drain) of the field effect transistor 110a so as to allow the first terminal 111 (i.e., the drain) to receive an RF power signal via the first signal pad 121. The second signal pad 131 (i.e., the RF signal output port) can also be electrically connected to the first terminal 111 (i.e., the drain) of the field effect transistor 110a so that the second signal pad 131 can receive an output RF power signal from the first terminal 111 and can output that output RF power signal. One or more of the first and second ground pads (e.g., see first ground pad 123 and second ground pad 133) can be electrically connected to the second terminal 112 (i.e., the source) of the field effect transistor 110a, thereby electrically connecting that second terminal 112 to ground. Finally, the first DC bias pad 141 and a first serial resistor 151 can be electrically connected in series to the third terminal 113 (i.e., the gate) and the second DC bias pad 142 and a second serial resistor 152 can be electrically connected in series to the fourth terminal 114 (i.e., the body or additional gate). The first serial resistor 151 and the second serial resistor 152 can each have a resistance value ($R_1$ and $R_2$, respectively) that is relatively high, for example, 1 kohm or greater.

Figure 4:
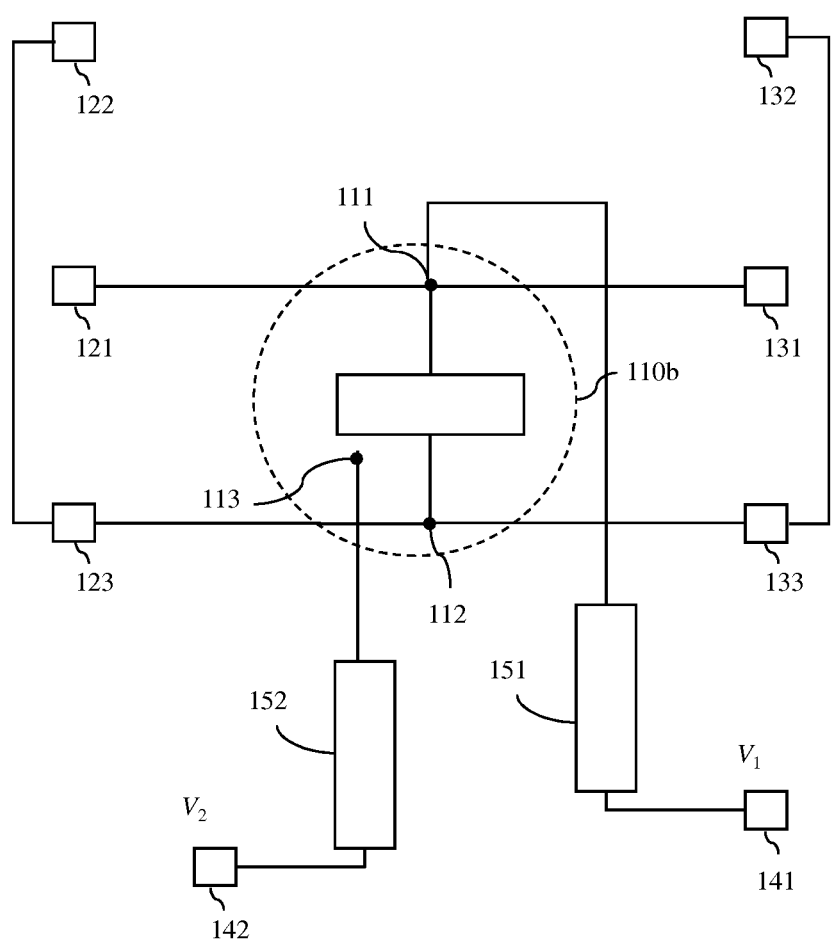
FIG. 4 is a schematic diagram illustrating the test structure of FIG. 1 incorporating a high resistance resistor.

As discussed in greater detail below with regard to the disclosed test system and method, such a test structure 100A can be used to apply RF power stress (or a combination of DC power stress and RF power stress) to the integrated circuit device 110a when the integrated circuit device is in the off-state, to test the performance of the integrated circuit device 110a following application of such stress and, based on the results of performance testing, to characterize the impact of such stress (i.e., RF power stress or a combination of DC power stress and RF power stress) on the performance of a field effect transistor 110a when that field effect transistor 110a is in an off-state and, particularly, to characterize an off-state hot-carrier (e.g., hot-electron) injection-type failure mechanism exhibited by the field effect transistor in response to the applied stress, FIG. 4 is an exemplary test structure 100B, wherein the integrated circuit device specifically comprises a resistor 110b. This resistor 110b can comprise any suitable type of resistor (e.g., a polycrystalline semiconductor resistor, a metal resistor, a diffused resistor in a well region of a semiconductor substrate, etc.). The resistor 110b can be configured so as to have a relatively high resistance and, thereby a relatively high impedance (e.g., an impedance value that is, for example, at least 5-10 times greater than 50 ohms, greater than 250 ohms, etc.).

In the test structure 100B, the resistor 110b can comprise a first terminal 111, a second terminal 112 opposite the first terminal 111 and, optionally, a third terminal 113. The first terminal 111 can comprise a first contact at one end of the resistor 110b and the second terminal 112 can comprise a second contact at the opposite end of the resistor 110b. The third terminal 113 can comprise a substrate contact, for example, if resistor 110b comprises a diffused resistor in a well region of a semiconductor substrate. The first signal pad 121 (i.e., the RF signal input port) can be electrically connected to the first terminal 111 (i.e., the first contact) of the resistor 110b so as to allow the first terminal 111 (i.e., the first contact) to receive an RF power signal via the first signal pad 121. The second signal pad 131 (i.e., the RF signal output port) can also be electrically connected to the first terminal 111 (i.e., the first contact) of the resistor 110b so that the second signal pad 131 can receive an output RF power signal from the first terminal 111 and can output that output RF power signal. One or more of the first and second ground pad(s) (e.g., see first ground pad 123 and second ground pad 133) can be electrically connected to the second terminal 112 (i.e., the second contact), thereby electrically connecting the second terminal 112 to ground. Finally, the first DC bias pad 141 and a first serial resistor 151 (both are optional for biasing) can be electrically connected in series to the first terminal 111 (i.e., the first contact). Optionally, if the resistor 110b comprises a third terminal 113 (i.e., a substrate contact), the second DC bias pad 142 and a second serial resistor 152 can be electrically connected in series to the third terminal 113. The first serial resistor 151 and the second serial resistor 152 can each have a resistance value ($R_1$ and $R_2$, respectively) that is relatively high, for example, 1 kohm or greater.

As discussed in greater detail below with regard to the disclosed test system and method, such a test structure 100B can be used to apply RF power stress (or, optionally, a combination of DC power stress and RF power stress) to the high resistance resistor 110b, to test the performance of the resistor 110b following application of such stress and, based on the results of performance testing, to characterize the impact of such stress (i.e., RF power stress or the combination of DC power stress and RF power stress) on the performance of the high resistance resistor 110b and, more specifically, to characterize any shift in the resistance of the resistor 110b and/or any fault (e.g., an open or short) formed in the resistor 110b in response to the applied stress.

Figure 5:
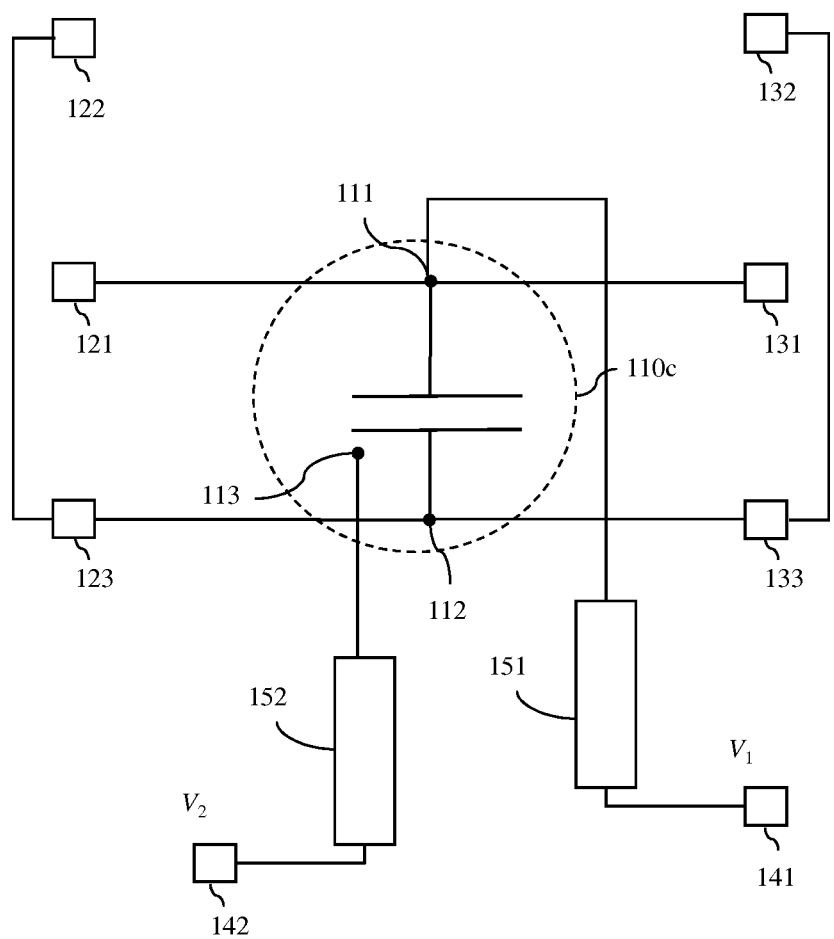
FIG. 5 is a schematic diagram illustrating the test structure of FIG. 1 incorporating a low capacitance capacitor.

FIG. 5 is an exemplary test structure 100C, wherein the integrated circuit device specifically comprises a capacitor 110c. This capacitor 110c can be configured so as to have a relatively low capacitance and, thereby a relatively high impedance (e.g., an impedance value that is, for example, at least 5-10 times greater than 50 ohms, greater than 250 ohms, etc.).

In this test structure 100C, the capacitor 110c can comprise a first terminal 111, a second terminal 112 opposite the first terminal 111 and, optionally, a third terminal 113. The first terminal 111 can comprise a first conductive plate and the second terminal 112 can comprise a second conductive plate opposite the first conductive plate (i.e., separated from the first conductive plate by a dielectric plate). The third terminal 113 can comprise a substrate contact, for example, if one or both of the conductive plates 111-112 are doped regions of a semiconductor substrate. The first signal pad 121 (i.e., the RF signal input port) can be electrically connected to the first terminal 111 (i.e., the first conductive plate) of the capacitor 110c so as to allow the first terminal 111 (i.e., the first conductive plate) to receive an RF power signal via the first signal pad 121. The second signal pad 131 (i.e., the RF signal output port) can also be electrically connected to the first terminal 111 (i.e., the first conductive plate) of the capacitor 110c so that the second signal pad 131 can receive an output RF power signal from the first terminal 111 and can output that output RF power signal. One or more of the first and second ground pad(s) (e.g., see the first ground pad 123 and the second ground pad 133) can be electrically connected to the second terminal 112 (i.e., to the second conductive plate), thereby electrically connecting the second terminal 112 to ground. Finally, the first DC bias pad 141 and a first serial resistor 151 (both are optional for biasing) can be electrically connected in series to the first terminal 111 (i.e., the first conductive plate) and, optionally, if the capacitor 110c comprises a third terminal 113 (i.e., a substrate contact), the second DC bias pad 142 and a second serial resistor 152 can be electrically connected in series to the third terminal 113. The first serial resistor 151 and the second serial resistor 152 can each have a resistance value ($R_1$ and $R_2$, respectively) that is relatively high, for example, 1 kohm or greater.

As discussed in greater detail below with regard to the disclosed test system and method, such a test structure 100C can be used to apply RF power stress (or, optionally, a combination of DC power stress and RF power stress) to the low capacitance capacitor 110c, to test the performance of the capacitor 110c following the application of such stress and, based on the results of performance testing, to characterize the impact of such stress (i.e., RF power stress or a combination of DC power stress and RF power stress) on the performance of the low capacitance capacitor 110c and, more specifically, to characterize any current leakage and/or dielectric breakdown in the capacitor 110c in response to the applied stress.

Figure 6:
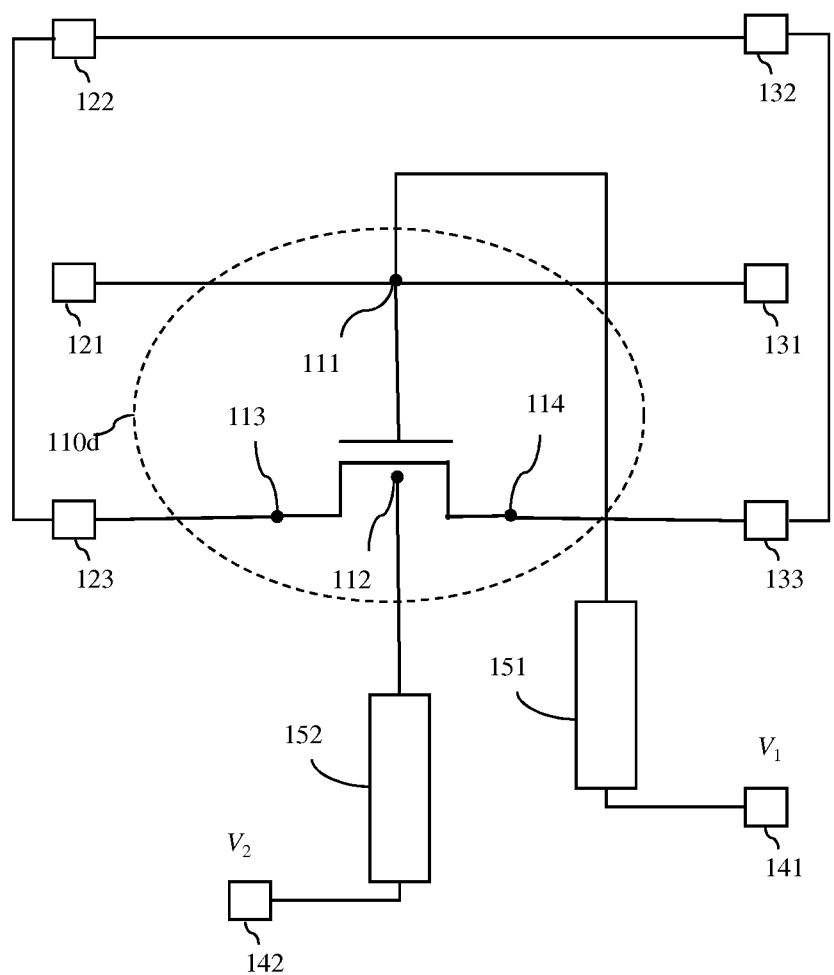
FIG. 6 is a schematic diagram illustrating the test structure of FIG. 1 incorporating another field effect transistor.

FIG. 6 is a schematic diagram illustrating an exemplary test structure 100D, wherein the integrated circuit device specifically comprises a field effect transistor 110d. In the test structure 100D, the field effect transistor 110d can comprise a first terminal 111, a second terminal 112 opposite the first terminal 111, a third terminal 113 and a fourth terminal 114 opposite the third terminal 113. The first terminal 111 can comprise a gate, the second terminal 112 can comprise a body (or an additional gate opposite the gate), the third terminal 113 can comprise a source and the fourth terminal 114 can comprise a drain opposite the source (i.e., separated from the source by a channel). The first signal pad 121 (i.e., the RF signal input port) can be electrically connected to the first terminal 111 (i.e., the gate) of the field effect transistor 110d so as to allow the first terminal 111 (i.e., the gate) to receive an RF power signal via the first signal pad 121. The second signal pad 131 (i.e., the RF signal output port) can also be electrically connected to the first terminal 111 (i.e., the gate) of the field effect transistor 110d so that the second signal pad 131 can receive an output RF power signal from the first terminal 111 and can output that output RF power signal. One or more of the first ground pad(s) (e.g., see first ground pad 123) can be electrically connected to the third terminal 113 (i.e., the source) and one or more of the second ground pad(s) (e.g., see second ground pad 133) can be electrically connected to the fourth terminal 114 (i.e., the drain) of the field effect transistor 110d, thereby electrically connecting the third and fourth terminals 113-114 (i.e., the source and drain) to ground. Finally, the first DC bias pad 141 and a first serial resistor 151 (both are optional for biasing) can be electrically connected in series to the first terminal 111 (i.e., the gate) and the second DC bias pad 142 and a second serial resistor 152 can be electrically connected in series to the second terminal 112 (i.e., the body or additional gate). The first serial resistor 151 and the second serial resistor 152 can each have a resistance value ($R_1$ and $R_2$, respectively) that is relatively high, for example, 1 kohm or greater.

As discussed in greater detail below with regard to the disclosed test system and method, such a test structure 100D can be used to apply RF power stress (or, optionally, a combination of DC power stress and RF power stress) to the field effect transistor 110d, to test the performance of that field effect transistor 110d following application of such stress and, based on the results of performance testing, to characterize the impact of such stress (i.e., RF power stress or a combination of DC power stress and RF power stress) on the performance of the field effect transistor 110d and, particularly, to characterize a time-dependent dielectric breakdown (TDDB)-type failure mechanism exhibited by the field effect transistor 110d in response to the applied stress.

It should be noted that in each of the test structures 100A-100D of FIGS. 3-6 described above, even though the integrated circuit devices 110a-110d exhibit relatively high impedance, impedance matching issues are avoided during application of RF power stress because the RF power signal is applied to and captured at the same terminal. That is, because the RF power signal does not actually pass from the first signal pad 121 (i.e., the RF signal input port) through the high impedance device to the second signal pad 131 (i.e., the RF signal output port), impedance tuning is not required.

Figure 7:
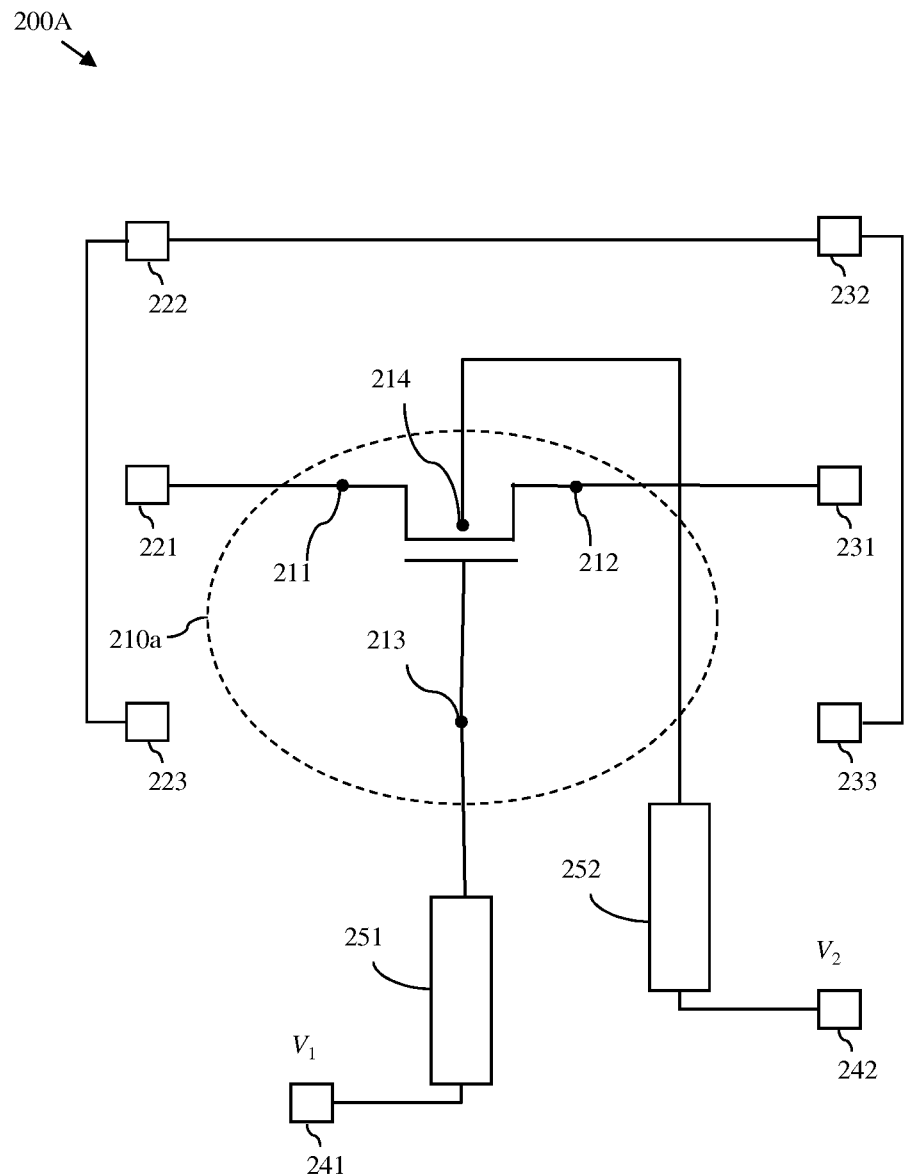
FIG. 7 is a schematic diagram illustrating the test structure of FIG. 2 incorporating a field effect transistor in an on-state.
Figure 8:
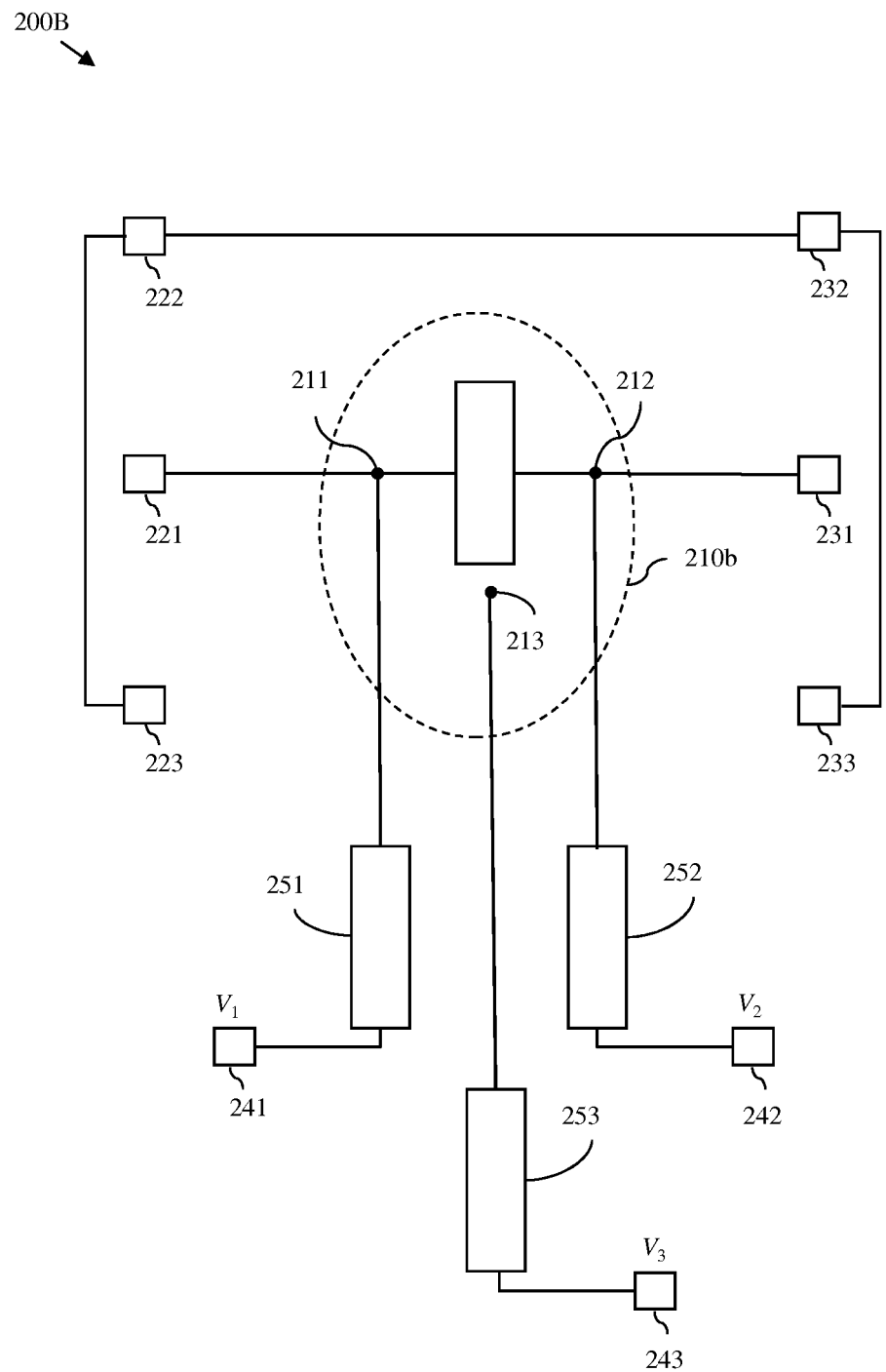
FIG. 8 is a schematic diagram illustrating the test structure of FIG. 2 incorporating a low resistance resistor.
Figure 9:
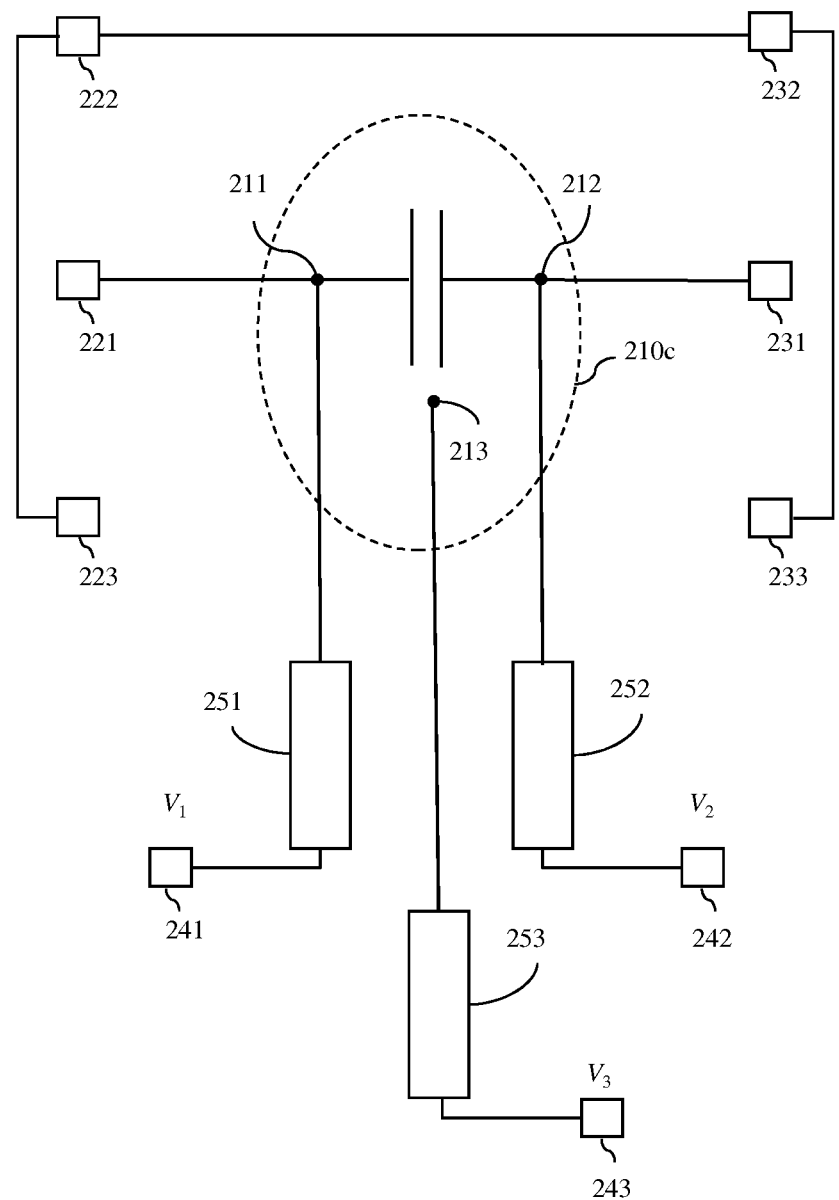
FIG. 9 is a schematic diagram illustrating the test structure of FIG. 2 incorporating a high capacitance capacitor.

FIGS. 7-9 are more detailed schematic diagrams illustrating various different configurations 200A-200C, respectively, for the test structure 200. These different configurations 200A-200C vary with regard to type of integrated circuit device 210 under test and/or the type of failure mechanism to be characterized.

For example, FIG. 7 is a schematic diagram illustrating an exemplary test structure 200A, wherein the integrated circuit device specifically comprises a field effect transistor 210a in an on-state (i.e., in a conducting state) such that resistance across the field effect transistor 210a (i.e., across the channel region between the source and drain regions) is relatively low. As a result, impedance will also be relatively low. Specifically, as discussed above, impedance is a complex value equal to the sum of both a real part and, particularly, resistance and an imaginary part and, particularly, reactance. Consequently, a field effect transistor 210a that is in an on-state (i.e., a conducting state) and, thereby exhibits relatively low resistance, will also exhibit relatively low impedance (e.g., an impedance value that is, for example, at least 5-10 times smaller than 50 ohms, less than 10 ohms, etc.).

In this test structure 200A, the field effect transistor 210a can comprise a first terminal 211, a second terminal 212 opposite the first terminal 211, a third terminal 213 and a fourth terminal 214 opposite the third terminal 213. The first terminal 211 can comprise a drain, the second terminal 212 can comprise a source opposite the drain (i.e., separated from the drain by a channel), the third terminal 213 can comprise a gate and the fourth terminal 214 can comprise a body or an additional gate opposite the gate. The first signal pad 221 (i.e., the RF signal input port) can be electrically connected to the first terminal 211 (i.e., the drain) of the field effect transistor 210a so as to allow the first terminal 211 (i.e., the drain) to receive an input RF power signal via the first signal pad 221. The second signal pad 231 (i.e., the RF signal output port) can be electrically connected to the second terminal 212 (i.e., the source) of the field effect transistor 210a so that the second signal pad 231 can receive an output RF power signal from the second terminal 212 (i.e., an RF power signal that has passed through the channel of the FET 210a from the drain to the source) and can output that output RF power signal. Finally, the first DC bias pad 241 and a first serial resistor 251 can be electrically connected in series to the third terminal 213 (i.e., the gate) and the second DC bias pad 242 and a second serial resistor 252 can be electrically connected in series to the fourth terminal 214 (i.e., the body or additional gate). The first serial resistor 251 and the second serial resistor 252 can each have a resistance value ($R_1$ and $R_2$, respectively) that is relatively high, for example, 1 kohm or greater.

As discussed in greater detail below with regard to the disclosed test system and method, such a test structure 200A can be used to apply RF power stress (or, optionally, a combination of DC power stress and RF power stress) to the field effect transistor 210a when that field effect transistor 210a is in an on-state, to test the performance of that field effect transistor 210a following application of such stress and, based on the results of performance testing, to characterize the impact of such stress (i.e., RF power stress or a combination of DC power stress and RF power stress) on the performance of the field effect transistor 210a and, particularly, to characterize an on-state hot-carrier (e.g., hot-electron) injection-type failure mechanism exhibited by that field effect transistor 210a.

FIG. 8 is an exemplary test structure 200B, wherein the integrated circuit device specifically comprises a resistor 210b. This resistor 210b can comprise any suitable type of resistor (e.g., a polycrystalline semiconductor resistor, a metal resistor, a diffused resistor in a well region of a semiconductor substrate, etc.). This resistor 210b can be configured so as to have a relatively low resistance and, thereby a relatively low impedance (e.g., an impedance value that is, for example, at least 5-10 times smaller than 50 ohms, less than 10 ohms, etc.).

In the test structure 200B, the resistor 210b can comprise a first terminal 211, a second terminal 212 opposite the first terminal 211 and, optionally, a third terminal 213. The first terminal 211 can comprise a first contact at one end of the resistor 210b and the second terminal 212 can comprise a second contact at the opposite end of the resistor 210b. The third terminal 213 can comprise a substrate contact, for example, if resistor 210b comprises a diffused resistor in a well region of a semiconductor substrate. The first signal pad 221 (i.e., the RF signal input port) can be electrically connected to the first terminal 211 (i.e., the first contact) of the resistor 210b so as to allow the first terminal 211 (i.e., the first contact) to receive an RF power signal via the first signal pad 121. The second signal pad 231 (i.e., the RF signal output port) can be electrically connected to the second terminal 212 (i.e., the second contact) of the resistor 210b so that the second signal pad 231 can receive an output RF power signal from the second terminal 212 through the resistor 210b (i.e., an RF power signal that has passed through the resistor 210b from the first contact to the second contact) and can output that output RF power signal. Finally, the first DC bias pad 241 and a first serial resistor 251 can be electrically connected in series to the first terminal 211 (i.e., the first contact) and the second DC bias pad 242 and a second serial resistor 252 can be electrically connected in series to the second terminal 212. Optionally, if the resistor 210b comprises a third terminal 213 (i.e., a substrate contact), the third DC bias pad 243 and a third serial resistor 253 can be electrically connected in series to the third terminal 213. The first serial resistor 251, the second serial resistor 252 and the third serial resistor 253 can each have a resistance value ($R_1$, $R_2$ and $R_3$, respectively) that is relatively high, for example, 1 kohm or greater.

As discussed in greater detail below with regard to the disclosed test system and method, such a test structure 200B can be used to apply RF power stress (or, optionally, a combination of DC power stress and RF power stress) to the lower resistance resistor 210b, to test the performance of the resistor 210b in response to such stress and, based on the results of performance testing, to characterize the impact of such stress (i.e., RF power stress or a combination of DC power stress and RF power stress) on the performance of the low resistance resistor 210b and, more specifically, to characterize any shift in the resistance of the resistor 210b and/or any fault (e.g., an open or short) formed in the resistor 210b in response to the applied stress.

FIG. 9 is an exemplary test structure 200C, wherein the integrated circuit device specifically comprises a capacitor 210c. This capacitor 210c can be configured so as to have a relatively high capacitance and, thereby a relatively low impedance (e.g., an impedance value that is, for example, at least 5-10 times smaller than 50 ohms, less than 10 ohms, etc.).

In this test structure 200C, the capacitor 210c can comprise a first terminal 211, a second terminal 212 opposite the first terminal 211 and, optionally, a third terminal 213. The first terminal 211 can comprise a first conductive plate and the second terminal 212 can comprise a second conductive plate opposite the first conductive plate (i.e., separated from the first conductive plate by a dielectric plate). The third terminal 213 can comprise a substrate contact, for example, if one or both of the conductive plates 211-212 are doped regions of a semiconductor substrate. The first signal pad 221 (i.e., the RF signal input port) can be electrically connected to the first terminal 211 (i.e., the first conductive plate) of the capacitor 210c so as to allow the first terminal 211 (i.e., the first conductive plate) to receive an RF power signal via the first signal pad 221. The second signal pad 231 (i.e., the RF signal output port) can be electrically connected to the second terminal 212 (i.e., the second conductive plate) of the capacitor 210c so that the second signal pad 231 can receive an output RF power signal from the second terminal 212 through the capacitor 210c (i.e., an RF power signal that has passed from the first conductive plate through a dielectric plate to the second conductive plate) and can output that output RF power signal. Finally, the first DC bias pad 241 and a first serial resistor 251 can be electrically connected in series to the first terminal 211 (i.e., the first conductive plate) and the second DC bias pad 242 and a second serial resistor 252 can be electrically connected in series to the second terminal 212 (i.e., the second conductive plate). Optionally, if the capacitor 210c comprises a third terminal 213 (i.e., a substrate contact), the third DC bias pad 243 and a third serial resistor 253 can be electrically connected in series to the third terminal 213. The first serial resistor 251, the second serial resistor 252, and third serial resistor 253 can each have a resistance value ($R_1$, $R_2$ and $R_3$, respectively) that is relatively high, for example, 1 kohm or greater.

As discussed in greater detail below with regard to the disclosed test system and method, such a test structure 200C can be used to apply RF power stress (or, optionally, a combination of DC power stress and RF power stress) to the high capacitance capacitor 210c, to test the performance of the capacitor 210 following the application of such stress and, based on the results of performance testing, to characterize the impact of such stress (i.e., RF power stress or a combination of DC power stress and RF power stress) on the performance of the high capacitance capacitor 210c and, more specifically, to characterize any current leakage and/or dielectric breakdown in the capacitor 210c in response to the applied stress.

It should be noted that in each of the test structures 200A-200C of FIGS. 7-9 described above, the integrated circuit devices 210a-210c exhibit relatively low impedance and, thus, impedance matching issues are avoided during application of RF power stress. That is, because the RF power signal passes from the first signal pad 221 (i.e., the RF signal input port) through a low impedance device to the second signal pad 231 (i.e., the RF signal output port), impedance tuning is not required.

Figure 10:
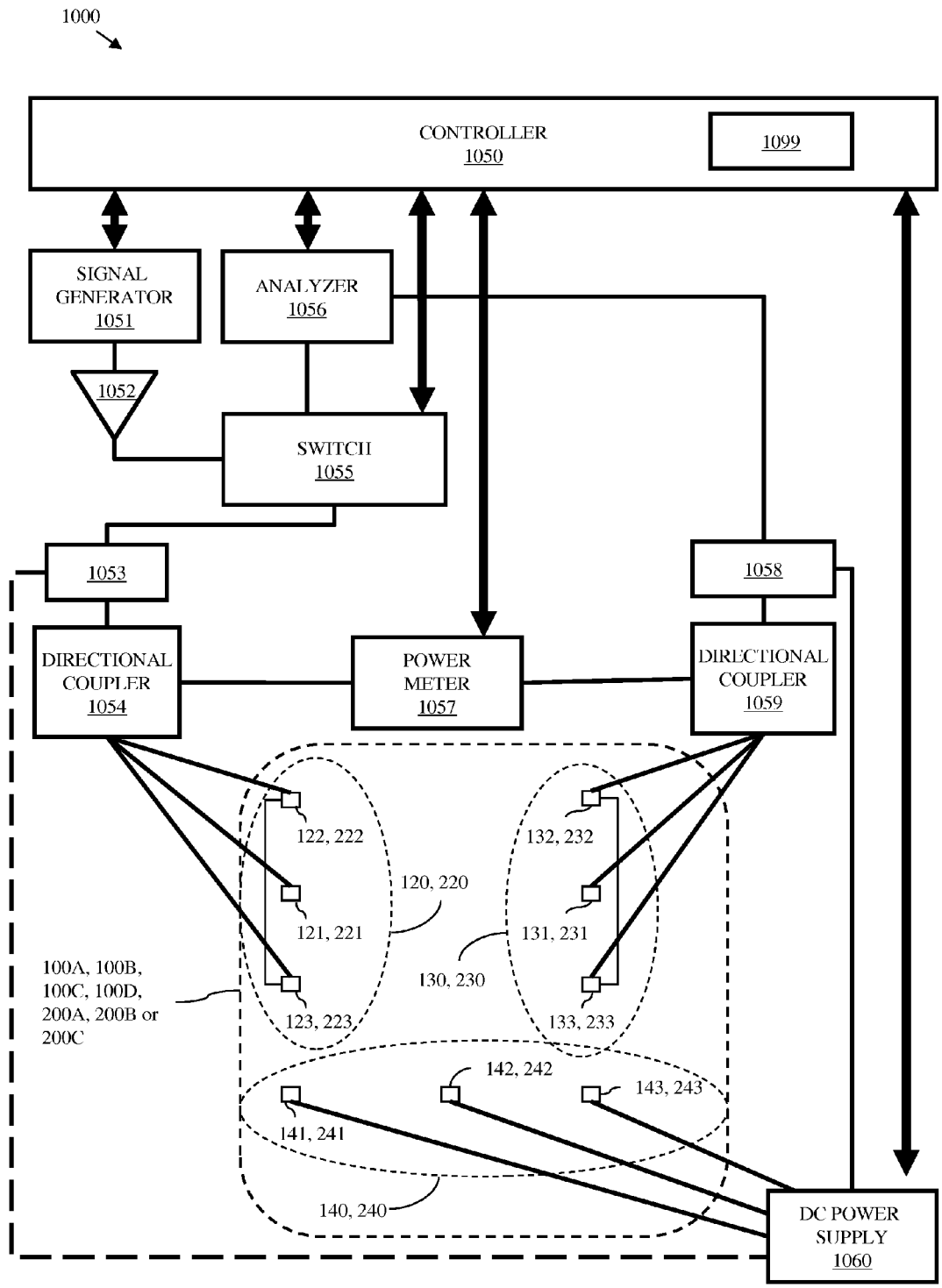
FIG. 10 is a schematic diagram illustrating a test system for stressing and characterizing the impact of stress on any of the test structures of FIGS. 1-9.

Referring to FIG. 10, also disclosed herein is a test system 1000 for selectively controlling operation of a test structure in different modes (i.e., in a stress mode and in an analysis mode) in order to characterize the impact of radio frequency (RF) power stress (or, optionally, a combination of direct current (DC) power stress and RF power stress) on an integrated circuit device contained therein.

Specifically, this test system 1000 can comprise any one of the above-described test structures 100 of FIG. 1 or 200 of FIG. 2 and, more particularly, the test system 1000 can comprise the test structure 100A of FIG. 3, 100B of FIG. 4, 100C of FIG. 5, 100D of FIG. 6, 200A of FIG. 7, 200B of FIG. 8 or 200C of FIG. 9. Such a test structure can be located within an integrated circuit chip region (i.e., as an on-chip test structure) or, alternatively, in the kerf region of a semiconductor wafer (i.e., adjacent to integrated circuit chip regions) with the pad re-arrangements.

This test system 1000 can further comprise a radio frequency (RF) signal generator 1051, a network analyzer 1056, an optional power meter 1057 and a DC power supply 1060 each electrically connected to that test structure 100, 200. For example, the DC power supply can be electrically connected to each of the one or more DC bias pads 141-143, 241-243 in the DC bias pad set 140, 240. Additionally, within the test system 100, the RF signal generator 1051 and the network analyzer 1056 can each be electrically connected to a switch 1055. Optionally, an amplifier 1052 can be electrically connected in series between the RF signal generator 1051 and the switch 1055. The switch 1055 can be electrically connected to a direct current (DC) blocking device 1053 (e.g., a DC block or bias tee, as discussed in greater detail below) and can selectively connect signals from either the RF signal generator 1051 or the network analyzer 1056 to that DC blocking device 1053. The DC blocking device 1053 can further be electrically connected in series to a first directional coupler 1054 and, if the DC blocking device 1053 comprises a bias tee, it can also be electrically connected to the DC power supply 1060. The first directional coupler 1054 can be electrically connected to each of the conductive pads 121-123, 221-223 in the first GSG pad set 120, 220 as well as to the power meter 1057. Furthermore, each of the conductive pads 131-133, 231-233 in the second GSG pad set 130, 230 can be electrically connected to a second directional coupler 1059 and this second directional coupler 1059 can be electrically connected to both the power meter 1057 and another DC blocking device 1058 and, particularly, to a bias tee. The bias tee 1058 can further be electrically connected to both the network analyzer 1056 and the DC power supply 1060.

The test system 1000 can further comprise a controller 1050 operatively connected to and controlling the RF signal generator 1051, the network analyzer 1056, the switch 1055, the power meter 1057, the DC power supply 1060, and a characterization tool 1099 in order to selectively operate the test structure 100, 200 in a stress mode in order to subject the integrated circuit device 110, 210 contained therein to RF power stress (or, optionally, to a combination of DC power stress and RF power stress) and in an analysis mode in order to test the performance of the integrated circuit device 110, 210 following application of such stress and, based on the results of performance testing, to characterize the impact of such stress (i.e., RF power stress or a combination of DC power stress and RF power stress) on that integrated circuit device 110, 210. It should be noted that the characterization tool 1099 can comprise a component of the controller 1050, as shown. For example, the characterization tool 1099 can comprise software (e.g., firmware) that is executable by the controller 1050. Alternatively, the characterization tool can comprise a discrete component (e.g., another computerized device) within the test system 1000. In this case, the characterization tool 1099 can be in communication with the controller 1050 (e.g., over a wired or wireless network) and can be either co-located with the controller 1050 or remotely located.

Specifically, the controller 1050 can control (i.e., can be adapted to control, can be configured to control, can be programmed to control, etc.) the RF signal generator 1051, the switch 1055, the power meter 1057 and the DC power supply 1060 in order to selectively operate the test structure 100A, 100B, 100C, 100D, 200A, 200B or 200C in the stress mode. During this stress mode, an RF open-circuit can be established between one or more of the multiple terminals (e.g., 111, 112, 113, etc. or 211, 212, 213, etc.) of the integrated circuit device 110, 210 and the DC power supply 1060. For purposes of this disclosure an RF open-circuit refers to a circuit showing high impedance to RF signal so that there is no RF current flow into the circuit. Additionally, the first signal pad 121, 221 and, thereby the first terminal 111, 211 can receive an input RF power signal from the RF signal generator 1051 (via the amplifier 1052, switch 1055, DC blocking device 1053 and first directional coupler 1054). That is, the switch 1055 can transmit an input RF power signal from the RF signal generator 1051 to the DC blocking device 1053 and, thereby to the first directional coupler 1054. The first directional coupler 1054 can then apply the input RF power signal to the first signal pad 121, 221 (i.e., to the RF signal input port) and the second signal pad 131, 231 (i.e., the RF signal output port) can output an output RF power signal (i.e., the second signal pad 131, 231 can receive an output RF power signal from either the first terminal 111 in a test structure 100 or the second terminal 212 in a test structure 200, as applicable, and can output that output RF power signal).

Also, during this stress mode, the first directional coupler 1054 can also apply the input RF power signal to the power meter 1057 and the second directional coupler 1059 can apply the output RF power signal to the power meter 1057 so that the power meter 1057 can compare these signals in order to monitor the path loss and the impedance mismatch. As discussed above, impedance mismatch should not be an issue given the configurations of the test structures. That is, because in the test structures 100A, 100B, 100C and 100D are both connected to the same terminal and because in the test structures 200A, 200B and 200C the integrated circuit devices have low impedance, impedance mismatch is not expected to be an issue. Therefore, when impedance mismatch is detected by the power meter 1057 (e.g., when the output RF power signal is less than 95% that of the input RF power signal, less than 90% that of the input RF power signal, etc.), the test structure can be identified as faulty.

The controller 1050 can further control the RF signal generator 1051, the network analyzer 1056, the switch 1055, the DC power supply 1060, and the characterization tool 1099 during the analysis mode, in order to test the performance of the integrated circuit device 110, 210 following application of stress and, particularly, RF power stress alone or a combination of DC power stress and RF power stress (e.g., by performing direct current (DC) sweep testing and/or S-parameter testing) and to characterize the impact of such stress on the performance of the integrated circuit device 110, 210 based on the results of performance testing. Depending upon the type of integrated circuit device at issue and the configuration of the test structure, this characterization may be directed to a particular failure mechanism exhibited by the integrated circuit device following application of stress.

It should be understood that the specifications used by the test system 1000 during the stress mode and failure mechanisms considered by the test system 1000 during the analysis mode will vary as a function of the test structure.

For example, the test system 1000 of FIG. 10 can incorporate a test structure such as the test structure 100A of FIG. 3, wherein the integrated circuit device specifically comprises a field effect transistor 110a in an off-state (i.e., in a non-conducting state) such that resistance across the field effect transistor 110a (i.e., across the channel region between the source and drain regions) is relatively high and, as a result, impedance is also relatively high (e.g., at least 5-10 times greater than 50 ohms, greater than 250 ohms, etc.).

In this case, during the stress mode (i.e., when the first terminal 111 and, particularly, the drain receives an input RF power signal from the first signal pad 121 and the second signal pad 131 receives an output RF power signal from that same first terminal 111), the first voltage $V_1$ at the first DC bias pad 141 to the third terminal 113 (i.e., to the gate) and the second voltage $V_2$ at the second DC bias pad 142 to the fourth terminal 114 (i.e., to the body or additional gate), as supplied by the DC power supply 1060 and controlled by the controller 1050, can be set such that an RF open-circuit is established between the third terminal 113 (i.e., the gate), the fourth terminal 114 (i.e., the body or additional gate), and the DC power supply, and further such that the field effect transistor 110a remains in an off-state with a relatively high impedance. For example, the first and second voltages $V_1$ and $V_2$ can be set at $-\frac{1}{2}$ to $-1$ times the voltage on the first terminal 111 (i.e., the drain voltage), which may or may not DC biased during the stress mode. Optionally, during this stress mode, DC power stress from the DC power supply 1060 can also be applied to the first terminal 111 through the first signal pad 121 via a bias tee 1053 and first directional coupler 1054.

In this case, during the analysis mode, both the first terminal 111 (i.e., the drain) and the second terminal 112 (i.e., the source) can be evaluated for hot-carrier (e.g., hot-electron) injection-induced damage. Specifically, after the stress mode, the network analyzer 1056 in conjunction with the DC power supply 1060 and, as controlled by the controller 1050, can perform performance testing of the integrated circuit device 110a. This performance testing can comprise S-parameter testing, DC sweep testing and/or any other suitable performance testing. Those skilled in the art will recognize that S-parameter testing (also referred to herein as Scattering parameter testing) typically involves recording RF performance of a multiple-port device/network in the terms of reflected/delivered and applied wave ratios from/through the device/network. Those skilled in the art will recognize that DC sweep testing is used to obtain current-voltage (IV) curves with gate voltage and drain voltage sweeps. Thus, the network analyzer 1056 in conjunction with the DC power supply 1060, as controlled by the controller 1050, can, for certain fixed drain, gate and body biases, sweep frequency at a given RF power (e.g., an RF power that is much lower than the RF power level used during the stress mode) to collect RF performance data and, particularly, S-parameter data. Additionally or alternatively, the controller 1050 can control the DC power supply 1060 with RF power off of the network analyzer 1056, to sweep the first voltage $V_1$ at the third terminal 113 (i.e., the gate), the second voltage $V_2$ at the fourth terminal 114 (i.e., the body), and a third voltage $V_3$ at the first terminal 111 (i.e., the drain) to obtain current-voltage (I/V) curves (e.g., curves illustrating the drain-source current (Ids) and off current (Ioff) for certain first and third voltages $V_1$ and $V_3$, such as $V_1$>Vt and $V_3$=Vdd). The results of performance testing (e.g., the I/V curves and/or the S-parameter data) can be communicated to and evaluated by the characterization tool 1099, which characterizes (i.e., is adapted to characterize, configured to characterize, programmed to characterize, etc.) the impact of the applied stress (i.e., RF power stress alone or a combination of DC power stress and RF power stress) on the field effect transistor 110a and, particularly, detects any off-state hot-carrier (e.g., hot-electron) injection-induced damage (i.e., characterizes an off-state hot-carrier injection-type failure mechanism exhibited by the integrated circuit device 110a in response to application of stress). Any detected hot-carrier injection-induced damage and the recorded S-parameter data can then be used (e.g., by the characterization tool 1099) to perform a reliability evaluation (e.g., to predict the useful life of the field effect transistor 110a).

Alternatively, the test system 1000 of FIG. 10 can incorporate a test structure such as the test structure 100B of FIG. 4, wherein the integrated circuit device specifically comprises a high resistance resistor 110b (i.e., a resistor with a relatively high impedance).

In this case, during the stress mode (i.e., when the first terminal 111 and, particularly, a first contact receives an input RF power signal from the first signal pad 121 and the second signal pad 131 receives an output RF power signal from that same first terminal 111), the first voltage $V_1$ at the first DC bias pad 141 to the first terminal 111 (i.e., to the first contact) and, if applicable, the second voltage $V_2$ at the second DC bias pad 142 to the third terminal 113 (i.e., to the substrate contact), as supplied by the DC power supply 1060, can be set such that an RF open-circuit is established between the first terminal 111 (i.e., the first contact), the third terminal 113 (i.e., the substrate contact), and the DC power supply. It should be noted that to avoid the need for impedance tuning processes, the voltages $V_1$ and $V_2$ should be set such that, given the resistor material, size, etc., the impedance of the resistor 110b remains relatively high during the stress mode (e.g., at least 5-10 times greater than 50 ohms, greater than 250 ohms, etc.). Optionally, during this stress mode, DC power stress from the DC power supply 1060 can also be applied to the first terminal 111 through the first signal pad 121 via a bias tee 1053 and first directional coupler 1054.

In this case, during the analysis mode, the resistor 110b can be evaluated for any resistance shift over time and/or any opens or shorts resulting from the applied stress. Specifically, after the stress mode, the network analyzer 1056 in conjunction with the DC power supply 1060, and as controlled by the controller 1050, can perform performance testing of the integrated circuit device 110b. This performance testing can comprise S-parameter testing, DC sweep testing and/or any other suitable performance testing. Thus, the network analyzer 1056 in conjunction with the DC power supply 1060, as controlled by the controller 1050, can, for certain terminal and body biases, sweep frequency at a given RF power (much lower than the level for RF stress) to collect RF performance data and, particularly, S-parameter data. Additionally, or alternatively, the controller 1050 can control the DC power supply 1060 with RF power off of the network analyzer 1056, to sweep the first terminal 111 and the second terminal 112 to obtain the currents and voltages at those terminals. The results of the performance testing (e.g., the S-parameter data and the currents and voltages at the terminals) can be communicated to and evaluated by the characterization tool 1099, which characterizes (i.e., is adapted to characterize, configured to characterize, programmed to characterize, etc.) the impact of the applied stress (i.e., the RF power stress or the combination of DC power stress and RF power stress) on the resistor 110b and, particularly, characterizes (i.e., detects) any shift in the resistance of the resistor 110b and/or any fault (e.g., an open or short) in the resistor 110b that occurred because of the applied stress. Any detected resistance shift and/or fault within the resistor 110b along with the recorded S-parameter data can then be used (e.g., by the characterization tool 1099) to perform a reliability evaluation (e.g., to predict the useful life of the resistor 110b).

Alternatively, the test system 1000 of FIG. 10 can incorporate a test structure such as the test structure 100C of FIG. 5, wherein the integrated circuit device specifically comprises a low capacitance capacitor 110c (i.e., a capacitor with a relatively high impedance).

In this case, during the stress mode (i.e., when the first terminal 111 and, particularly, a first conductive plate receives an input RF power signal from the first signal pad 121 and the second signal pad 131 receives an output RF power signal from that same first terminal 111), the first voltage $V_1$ at the first DC bias pad 141 to the first terminal 111 (i.e., to the first conductive plate) and, if applicable, the second voltage $V_2$ at the second DC bias pad 142 to the third terminal 113 (i.e., to the substrate contact), as supplied by the DC power supply 1060, can be set such that an RF open-circuit is established between the first terminal 111 (i.e., the first conductive plate), the third terminal 113 (i.e., the substrate contact), and the DC power supply. It should be noted that to avoid the need for impedance tuning processes, the voltages $V_1$ and $V_2$ should be set such that, given the capacitor materials, dielectric thickness, etc., the impedance of the capacitor 110c remains relatively high during the stress mode (e.g., at least 5-10 times greater than 50 ohms, greater than 250 ohms, etc.). Optionally, during this stress mode, DC power stress from the DC power supply 1060 can also be applied to the first terminal 111 through the first signal pad 121 via a bias tee 1053 and first directional coupler 1054.

In this case, during the analysis mode, the capacitor 110c can be evaluated for any current leakage and/or dielectric breakdown over time. Specifically, after the stress mode, the network analyzer 1056 in conjunction with the DC power supply 1060, as controlled by the controller 1050, can perform performance testing of the integrated circuit device 110c. This performance testing can comprise S-parameter testing, DC sweep testing and/or any other suitable performance testing. Thus, the network analyzer 1056 in conjunction with the DC power supply 1060, as controlled by the controller 1050, can, for certain terminal and body biases, sweep frequency at a given RF power (much lower than the level for RF stress) to collect RF performance data and, particularly, S-parameter data. Additionally or alternatively, the controller 1050 can control the DC power supply 1060 with RF power off of the network analyzer 1056 to sweep the voltage at the first terminal 111 (i.e., the first capacitor plate). The results of such performance testing (e.g., S-parameter data and/or the voltage at the first terminal) can be communicated to and evaluated by the characterization tool 1099, which characterizes (i.e., is adapted to characterize, configured to characterize, programmed to characterize, etc.) the impact of the applied stress (i.e., RF power stress or a combination of DC power stress and RF power stress) on the capacitor 110c and, particularly characterizes (i.e., detects) any current leakage and/or dielectric breakdown in the capacitor 110c as a result of the applied stress. Any detected current leakage and/or dielectric breakdown within the capacitor 110c along with the recorded S-parameter data can then be used (e.g., by the characterization tool 1099) to perform a reliability evaluation (e.g., to predict the useful life of the capacitor 110c).

Alternatively, the test system 1000 of FIG. 10 can incorporate a test structure such as the test structure 100D of FIG. 6, wherein the integrated circuit device specifically comprises a field effect transistor 110d.

In this case, during the stress mode (i.e., when the first terminal 111 and, particularly, the gate receives an input RF power signal from the first signal pad 121 and the second signal pad 131 receives an output RF power signal from that same first terminal 111), the first voltage $V_1$ at the first DC bias pad 141 to the first terminal 111 (i.e., to the gate) and the second voltage $V_2$ at the second DC bias pad 142 to the second terminal 112 (i.e., to the body or additional gate), as supplied by the DC power supply 1060, can be set such that an RF open-circuit is established between the first terminal 111 (i.e., the gate), the second terminal 112 (i.e., the body or additional gate), and the DC power supply. Additionally, the third terminal 113 (i.e., the source) and the fourth terminal 114 (i.e., the drain) can each be electrically connected to ground. Optionally, during this stress mode, DC power stress from the DC power supply 1060 can also be applied to the first terminal 111 through the first signal pad 121 via a bias tee 1053 and first directional coupler 1054.

In this case, during the analysis mode, the field effect transistor 110d can be evaluated for time-dependent dielectric breakdown (TDDB). Specifically, after the stress mode, the network analyzer 1056 in conjunction with the DC power supply 1060, as controlled by the controller 1050, can perform performance testing of the integrated circuit device 110d. This performance testing can comprise S-parameter testing, DC sweep testing and/or any other suitable performance testing. Thus, the network analyzer 1056 in conjunction with the DC power supply 1060, as controlled by the controller 1050, can, for certain terminal and body biases, sweep frequency at a given RF power (e.g., an RF power that is much lower than the RF power level used during the stress mode) to collect RF performance data and, particularly, S-parameter. Additionally or alternatively, the controller 1050 can control the DC power supply 1060 with RF power off of the network analyzer 1056 to sweep the first voltage $V_1$ at the first terminal 111 (i.e., the gate) with the second terminal 112 (i.e., the body), the third terminal 113 (i.e., the source), and the fourth terminal 114 (i.e., the drain) connected to ground in order to obtain the gate current (Igate). The results of performance testing (e.g., the gate current (Igate) and/or S-parameter data) can then be communicated to and evaluated by the characterization tool, which characterizes (i.e., is adapted to characterize, configured to characterize, programmed to characterize, etc.) the impact of the applied stress (i.e., RF power stress or a combination of DC power stress and RF power stress) on the field effect transistor 110d and, more particularly, characterizes time-dependent dielectric breakdown (TDDB) exhibited by the field effect transistor 110d as a result of the applied stress. Any detected TDDB and the recorded S-parameter data can then be used (e.g., by the characterization tool 1099) to perform a reliability evaluation (e.g., to predict the useful life of the field effect transistor 110d).

Alternatively, the test system 1000 of FIG. 10 can incorporate a test structure such as the test structure 200A of FIG. 7, wherein the integrated circuit device specifically comprises a field effect transistor 210a in an on-state (i.e., in a conducting state) such that resistance across the field effect transistor 210a (i.e., across the channel region between the source and drain regions) is relatively low and, as a result, impedance is also relatively low.

In this case, during the stress mode (i.e., when the first terminal 211 and, particularly, the drain receives an input RF power signal from the first signal pad 221 and the second signal pad 231 receives an output RF power signal from that second terminal 212 and, particularly, the source), the first voltage $V_1$ at the first DC bias pad 241 to the third terminal 213 (i.e., to the gate) and the second voltage $V_2$ at the second DC bias pad 242 to the fourth terminal 214 (i.e., to the body or additional gate), as supplied by the DC power supply 1060, can be set such that an RF open-circuit is established between the third terminal 213 (i.e., the gate), the fourth terminal 214 (i.e., the body or additional gate), and the DC power supply, and further such that the field effect transistor 210a remains in an on-state with a relatively low impedance. For example, the first voltage $V_1$ can be greater than the threshold voltage of the field effect transistor 210b and the second voltage $V_2$ can be set at 0 or negative volts. Optionally, during this stress mode, DC power stress from the DC power supply 1060 can also be applied to the first terminal 211 through the first signal pad 221 via a bias tee 1053 and first directional coupler 1054.

In this case, during the analysis mode, both the first terminal 211 (i.e., the drain) and the second terminal 212 (i.e., the source) can be evaluated for hot-carrier (e.g., hot-electron) injection-induced damage. Specifically, after the stress mode, the network analyzer 1056 in conjunction with the DC power supply 1060 and, as controlled by the controller 1050, can perform performance testing of the field effect transistor 210a. This performance testing can comprise S-parameter testing, DC sweep testing and/or any other suitable performance testing. Thus, the network analyzer 1056 in conjunction with the DC power supply 1060, as controlled by the controller 1050, can, for certain terminal and body biases, sweep frequency at a given RF power (e.g., an RF power that is much lower than the RF power level during the stress mode) to collect RF performance data and, particularly, S-parameter data. Additionally or alternatively, the controller 1050 can control the DC power supply 1060 with RF power off of the network analyzer 1056 to ground the second terminal 212 (i.e., the source) and the fourth terminal 214 (i.e., the body) and sweep the voltages at the third terminal 213 (i.e., the gate) and the first terminal 211 (i.e., the drain) to obtain current-voltage (I/V) curves (e.g., an UV curve illustrating drain current (Id) to threshold voltage (Vt)). The results of performance testing (e.g., IV curves and/or S-parameter data) can be communicated to and evaluated by the characterization tool 1099, which characterizes (i.e., is adapted to characterize, configured to characterize, programmed to characterize, etc.) the impact of the applied stress (i.e., RF power stress or a combination of DC power stress and RF power stress) on the field effect transistor 210a and, particularly, detects any on-state hot-carrier (e.g., hot-electron) injection-induced damage (i.e., characterizes an on-state hot-carrier injection-type failure mechanism exhibited by the integrated circuit device 210a in response to application of stress). Any detected hot-carrier injection-induced damage and the recorded S-parameter data can then be used (e.g., by the characterization tool 1099) to perform a reliability evaluation (e.g., to predict the useful life of the field effect transistor 210a).

Alternatively, the test system 1000 of FIG. 10 can incorporate a test structure such as the test structure 200B of FIG. 8, wherein the integrated circuit device specifically comprises a low resistance resistor 210b (i.e., a resistor with a relatively low impedance).

In this case, during the stress mode (i.e., when the first terminal 211 and, particularly, a first contact receives an input RF power signal from the first signal pad 221 and the second signal pad 231 receives an output RF power signal from the second terminal 212 and, particularly, a second contact opposite the first contact), the first voltage $V_1$ at the first DC bias pad 241 to the first terminal 211 (i.e., to the first contact), the second voltage $V_2$ at the second DC bias pad 242 to the second terminal 212 (i.e., to the second contact) and, if applicable, the third voltage $V_3$ at the third DC bias pad 243 to the third terminal 213 (i.e., to the substrate contact), as supplied by the DC power supply 1060, can be set such that an RF open-circuit is established between the first terminal 211 (i.e., the first contact), the second terminal 212 (i.e., second contact), the third terminal 213 (i.e., the substrate contact) if applicable, and the DC power supply. It should be noted that to avoid the need for impedance tuning processes, the voltages $V_1$, $V_2$ and $V_3$ should be set such that, given the resistor material, size, etc., the impedance of the resistor 210b remains relatively low during the stress mode (e.g., at least 5-10 times smaller than 50 ohms, less than 10 ohms, etc.). Optionally, during this stress mode, DC power stress from the DC power supply 1060 can also be applied to the first terminal 211 through the first signal pad 221 via a bias tee 1053 and first directional coupler 1054.

In this case, during the analysis mode, the resistor 210b can be evaluated for any resistance shift over time and/or any opens or shorts. Specifically, after the stress mode, the network analyzer 1056 in conjunction with the DC power supply 1060 and, as controlled by the controller 1050, can perform performance testing of the integrated circuit device 210b. This performance testing can comprise S-parameter testing, DC sweep testing and/or any other suitable performance testing. Thus, the network analyzer 1056 in conjunction with the DC power supply 1060, as controlled by the controller 1050, can, for certain terminal and body biases, sweep frequency at a given RF power (e.g., an RF power level that is much lower than the power level used during the stress mode) to collect RF performance data and, particularly, S-parameter data. Additionally or alternatively, the controller 1050 can control the DC power supply 1060 with RF power off of the network analyzer 1056, to sweep the voltages at the first terminal 211 and the second terminal 212 to obtain the currents and voltages at those terminals. The results of performance testing (e.g., the S-parameter data and/or the currents and voltages at the terminals) can then be communicated to and evaluated by the characterization tool 1099, which characterizes (i.e., is adapted to characterize, configured to characterize, programmed to characterize, etc.) the impact of the applied stress (i.e., RF power stress or a combination of DC power stress and RF power stress) on the resistor 210b and, more specifically, characterizes (i.e., detects) any shift in the resistance of the resistor 210b and/or any fault (e.g., an open or short) in the resistor 210b as a result of the applied stress. Any detected resistance shift and/or fault within the resistor 210c along with the recorded S-parameter data can then be used (e.g., by the characterization tool 1099) to perform a reliability evaluation (e.g., to predict the useful life of the resistor 210b).

Alternatively, the test system 1000 of FIG. 10 can incorporate a test structure such as the test structure 200C of FIG.

9, wherein the integrated circuit device specifically comprises a high capacitance capacitor 210c (i.e., a capacitor with a relatively low impedance).

In this case, during the stress mode (i.e., when the first terminal 211 and, particularly, a first conductive plate receives an input RF power signal from the first signal pad 221 and the second signal pad 231 receives an output RF power signal from the second terminal 212 and, particularly, a second conductive plate opposite the first conductive plate), the first voltage $V_1$ at the first DC bias pad 241 to the first terminal 211 (i.e., to the first conductive plate), the second voltage $V_2$ at the second DC bias pad 242 to the second terminal 212 (i.e., to the second conductive plate) and, if applicable, the third voltage $V_3$ at the third DC bias pad 243 to the third terminal 213 (i.e., to the substrate contact), as supplied by the DC power supply 1060, can be set such that an RF open-circuit is established between the first terminal 211 (i.e., the first conductive plate), the second terminal 112 (i.e., second conductive), the third terminal 213 (i.e., the substrate contact) if applicable, and the DC power supply. It should be noted that to avoid the need for impedance tuning processes, the voltages $V_1$, $V_2$ and $V_3$ should be set such that, given the capacitor materials, dielectric thickness, etc., the impedance of the capacitor 210c remains relatively low during the stress mode (e.g., at least 5-10 times smaller than 50 ohms, less than 10 ohms, etc.). Optionally, during this stress mode, DC power stress from the DC power supply 1060 can also be applied to the first terminal 211 through the first signal pad 221 via a bias tee 1053 and first directional coupler 1054.

In this case, during the analysis mode, the capacitor 210c can be evaluated for any current leakage and/or dielectric breakdown over time. Specifically, after the stress mode, the network analyzer 1056 in conjunction with the DC power supply 1060 and, as controlled by the controller 1050 can perform performance testing. This testing can comprise S-parameter testing, DC sweep testing and/or any other suitable performance testing. Thus, the network analyzer 1056 in conjunction with the DC power supply 1060, as controlled by the controller 1050, can, for certain terminal and body biases, sweep frequency at a given RF power (e.g., an RF power that is much lower than the RF power level used during the stress mode) to collect RF performance data and, particularly, S-parameter data. Additionally or alternatively, the controller 1050 can control the DC power supply 1060 with RF power off of the network analyzer 1056, to sweep the voltages at the first terminal 211 (i.e., the first capacitor plate) and the second terminal 212 (i.e., the second capacitor plate). The results of performance testing (e.g., S-parameter data and/or the voltages at the first and second terminals) can be communicated to and evaluated by the characterization tool 1099, which characterizes (i.e., is adapted to characterize, configured to characterize, programmed to characterize, etc.) an impact of the applied stress (i.e., RF power stress or a combination of DC power stress and RF power stress) on the capacitor 210c and, more specifically, characterizes (i.e., detects) any current leakage and/or dielectric breakdown in the capacitor 210c as a result of the applied stress. Any detected current leakage and/or dielectric breakdown within the capacitor 210c along with the recorded S-parameter data can then be used (e.g., by the characterization tool 1099) to perform a reliability evaluation (e.g., to predict the useful life of the capacitor 110c).

As mentioned above, in the test system 1000, which incorporates any of the above-mentioned test structures 100A, 100B, 100C, 100D, 200A, 200B or 200C, the controller 1050 can optionally control the RF signal generator 1051, the network analyzer 1056, the switch 1055, the power meter 1057 and the DC power supply 1060, etc., during the stress mode, so that the integrated circuit device 110, 210 is stressed under a combination of RF power and DC power. That is, the first signal pad 121, 221 can receive both an RF power signal (e.g., from an RF signal generator 1051) as described and also a DC bias voltage (e.g., from the DC power supply 1060). In this case, it should be understood that the DC blocking device 1053 must be a bias tee, as opposed to a simple DC block, which receives both the input RF power signal from the switch 1055 and the DC bias voltage from the DC power supply and, thereby allows both the RF and DC power signals to be applied simultaneously to the first directional coupler 1054 and, thereby to the first signal pad 121, 221. In this case, the controller 1050 can further control the RF signal generator 1051, the network analyzer 1056, the switch 1055 and the DC power supply 1060, during the analysis mode, so that the impact of the combination of RF power and DC power stress can be characterized.

It should further be noted that the DC blocking device 1053 between the switch 1055 and the first directional coupler 1054 need only be a bias tee when a combined RF power and DC power stress are to be applied or when DC biasing of the first terminal 111, 211 is otherwise required (e.g., during the analysis mode for the test structure 200A with the field effect transistor 210a). Otherwise the DC blocking device 1053 can comprise a simple DC block, which prevents output impedance of the signal generator and/or amplifier from becoming a DC load on the integrated circuit device 110, 210.

Figure 11:
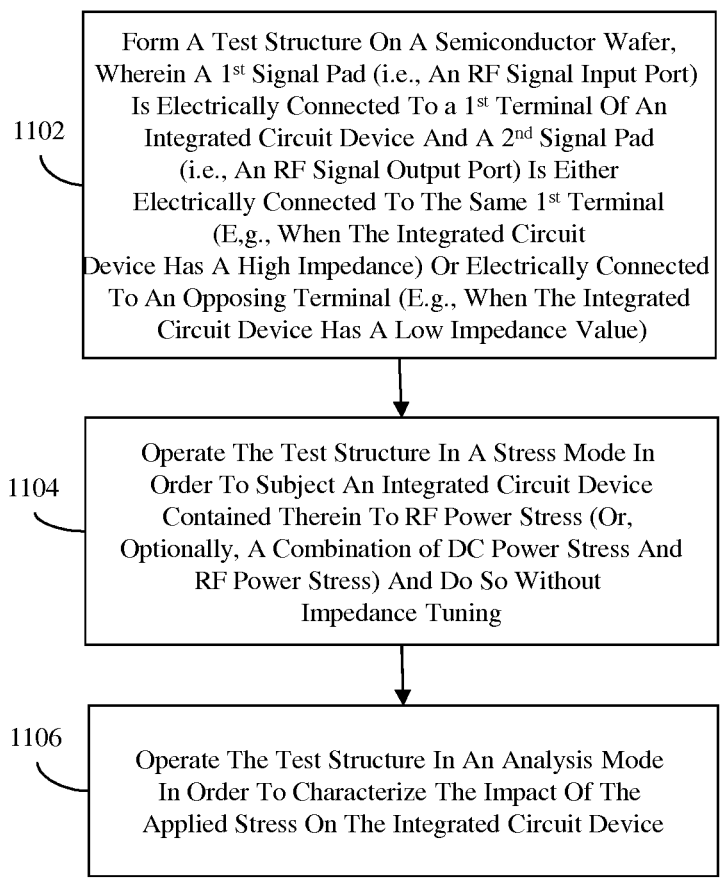
FIG. 11 is a flow diagram illustrating a test method for stressing and characterizing the impact of stress on any of the test structures of FIGS. 1-9.

Referring to the flow diagram FIG. 11 in combination with the test system diagram of FIG. 10 and the test structure diagrams of FIGS. 1-9, also disclosed herein is a test method for selectively controlling operation of a test structure in different modes (i.e., in a stress mode and an analysis mode) in order to characterize the impact of radio frequency (RF) power stress on an integrated circuit device contained therein.

This test method can comprise providing any one of the above-described test structures 100 of FIG. 1 or 200 of FIG. 2 and, more particularly, providing the test structure 100A of FIG. 3, 100B of FIG. 4, 100C of FIG. 5, 100D of FIG. 6, 200A of FIG. 7, 200B of FIG. 8 or 200C of FIG. 9 (1102). Such a test structure can be located on a semiconductor wafer within an integrated circuit chip region (i.e., as an on-chip test structure) or, alternatively, on a semiconductor wafer within a kerf region (i.e., within a region adjacent to integrated circuit chip regions, within a region separating integrated circuit regions, etc.) with pad re-arrangement.

Generally, each test structure 100, 200 can comprise an integrated circuit device 110, 210. This integrated circuit device 110, 210 can comprise a multi-terminal integrated circuit device such as a field effect transistor, a resistor, a capacitor, or any other suitable multi-terminal semiconductor device. In any case, the integrated circuit device 110, 210 can comprise at least a first terminal 111, 211 and a second terminal 112, 212 opposite the first terminal 111, 211. The test structure 100, 200 can further comprise two ground-signal-ground (GSG) pad sets including: a first GSG pad set 120, 220 comprising a first signal pad 121, 221 (i.e., an RF signal input port) between two first ground pads 122-123, 222-223; and a second GSG pad set 130, 230 comprising a second signal pad 131, 231 (i.e., an RF signal output port) between two second ground pads 132-133, 232-233. The first signal pad 121, 221 (i.e., the RF signal input port) of the first GSG pad set 120, 220 can be electrically connected to the first terminal 111, 211 of the integrated circuit device 110, 210 and the second signal pad 131, 231 (i.e., the RF signal output port) can be either electrically connected to the first terminal 111 (e.g., when the integrated circuit device 110 has a relatively high impedance value, such as in the test structure 100 of FIG. 1, see also the specific test structure configurations 100A-D of FIGS. 3-6) or electrically connected to the second terminal 212 (e.g., when the integrated circuit device has a relatively low impedance value, such as in the test structure 200 of FIG. 2, see also the specific test structure configurations 200A-C of FIGS. 7-9).

The method can further comprise selectively operating the test structure 100, 200 in either a stress mode in order to subject the integrated circuit device to RF power stress (or, optionally, to a combination of DC power stress and RF power stress) (1104) or an analysis mode in order to test the performance of the integrated circuit device 110, 210 following application of stress and, based on the results of performance testing, to characterize the impact of the applied stress (i.e., the RF power stress or combination of DC power stress and RF power stress) on the integrated circuit device 1110, 210 (1106).

Specifically, during the stress mode at process 1104, an RF open-circuit can be established between one or more of the multiple terminals of the integrated circuit device 110, 210 and the DC power supply 1060. For purposes of this disclosure an RF open-circuit refers to a circuit showing high impedance to RF signal so that there is no RF current flow into the circuit. Additionally, the first signal pad 121, 221 and, thereby the first terminal 111, 211 of the integrated circuit device 110, 210 can receive an input RF power signal (e.g., from an RF signal generator 1051). Then, the second signal pad 131, 231 (i.e., the RF signal output port) can output an output RF power signal (i.e., the second signal pad 131, 231 can receive an output RF power signal from either the first terminal 111 in a test structure 100 or the second terminal 212 in a test structure 200, as applicable, and can output that output RF power signal). Optionally, during the stress mode, the first signal pad 121, 221 and, thereby the first terminal 111, 211 of the integrated circuit device 110, 210 can also receive an input DC power bias (e.g., from the DC power supply 1060 via a bias tee 1053 and first directional coupler 1054).

During the analysis mode at process 1106, performance testing of the integrated circuit device can be performed. This performance testing can comprise S-parameter testing to acquire S-parameter data, DC sweep testing to acquire voltage and/or current data and/or any other suitable performance testing. Based on the results of such performance testing (e.g., based on S-parameter data, voltage and/or current data, etc.), the impact of the applied stress (i.e., RF power stress or a combination of DC power stress and RF power stress) on the performance of the integrated circuit device can be characterized. Depending upon the type of integrated circuit device at issue and the configuration of the test structure, this characterization may be directed to a particular failure mechanism, as discussed in detail above with regard to the various test structures and the test system.

Also disclosed herein is a computer program product. This computer program product can comprise a computer readable storage medium, which stores instructions executable by a computer (e.g., the controller in the test system 1000 of FIG. 10) to perform any of the above described process steps and/or methods. Accordingly, aspects of these techniques may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the disclosed techniques may take the form of a computer program product embodied in one or more computer readable medium(s) having computer readable program code embodied thereon.

Any combination of one or more computer readable medium(s) may be utilized. The computer readable medium may be a computer readable storage device or a computer readable signal medium. A computer readable storage medium is a tangible medium and may be, but is not limited to, any of the following: an electronic, magnetic, optical, electromagnetic, infrared, or semiconductor system, apparatus, or device, or any suitable combination of the foregoing. More specific examples (a non-exhaustive list) of the computer readable storage medium would include, but is not limited to, the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

As mentioned above, the computer readable medium can alternatively comprise a computer readable signal medium that includes a propagated data signal with computer readable program code embodied therein, for example, in baseband or as part of a carrier wave. Such a propagated signal may take any of a variety of forms, including, but not limited to, electromagnetic, optical, or any suitable combination thereof. This computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed method, system and computer program product are described above with reference to flowchart illustrations and/or block diagrams. It should be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

Figure 12:
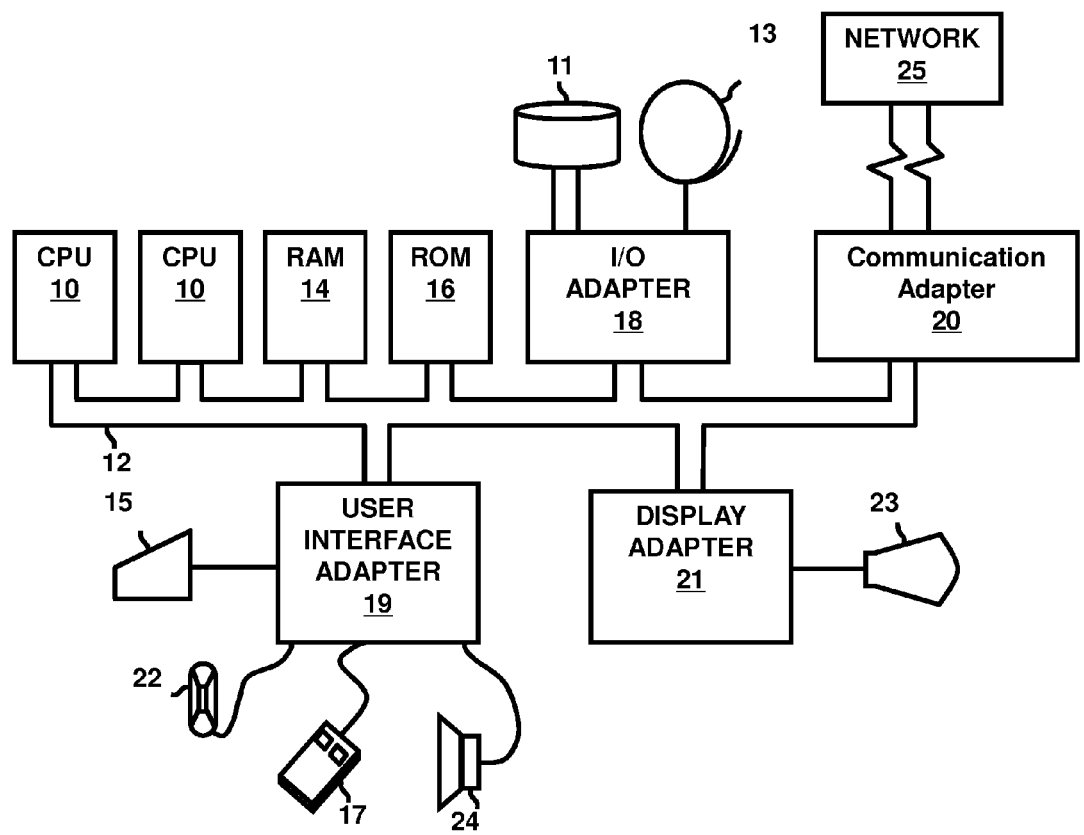
FIG. 12 a schematic diagram illustrating an exemplary hardware environment for implementing the above-disclosed system (or component(s) thereof) and method.

FIG. 12 is representative hardware environment for implementing the above-disclosed system(s) or components thereof, method(s) and/or computer program product(s). This schematic drawing illustrates a hardware configuration of a computerized device, such as an information handling/computer system. The computerized device comprises at least one processor or central processing unit (CPU) 10. The CPUs 10 are interconnected via bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the computerized device. The computerized device can read the inventive instructions on the program storage devices and follow these instructions to execute the methodology of the disclosed embodiments. The computerized device further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the flowcharts and block diagrams in the Figures referenced above illustrate the architecture, functionality, and operation of the various possible implementations of the above disclosed system, method and computer program product. In this regard, each block in the flowchart or block diagrams may represent a module, segment, or portion of code, which comprises one or more executable instructions for implementing the specified logical function(s). It should also be noted that, in some alternative implementations, the functions noted in any block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should also be noted that the terminology used herein is for the purpose of describing the system, method and computer program product and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including", specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed.

Therefore, disclosed above are improved test structures for RF power stressing and characterization. Each test structure can incorporate a single integrated circuit device (e.g., a field effect transistor, a resistor, a capacitor, etc.) and can be selectively operated in either a stress mode, during which the device is stressed under RF power, or in an analysis mode, during which the impact of the RF power stress on the performance of the device can be characterized. Specifically, during the stress mode, an input RF power signal is applied to the device through an RF signal input port and an output RF power signal is captured from the device at an RF signal output port. However, depending upon the impedance value of the integrated circuit device at issue, the RF signal input port and the RF signal output port can be either connected to the same terminal or connected to opposing terminals. For example, in a test structure with an integrated circuit device having a relatively high impedance value (e.g., a field effect transistor in an off-state, a low capacitance capacitor, high resistance resistor, etc.), the RF signal input port and the RF signal output port can be electrically connected to the same terminal, thereby avoiding any impedance mismatch. In a test structure with an integrated circuit device having a relatively low impedance value (e.g., a field effect transistor in an on-state, a high capacitance capacitor, a low resistance resistor, etc.), two opposing terminals can be connected to the RF signal input port and the RF signal output port, respectively, because impedance mismatch is not an issue. Such test structures have the added advantages of enabling the characterization to be performed with regard to a particular failure mechanism and no need for tuning process. Also disclosed herein are associated test systems and methods for selectively controlling operation of a test structure in different modes (i.e., in a stress mode and an analysis mode) in order to characterize the impact of RF power stress on an integrated circuit device contained therein.

The above-descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A test structure comprising:
   an integrated circuit device comprising multiple terminals comprising at least a first terminal and a second terminal opposite said first terminal;
   a first ground-signal-ground (GSG) pad set comprising a first signal pad between two first ground pads, said first signal pad being electrically connected to said first terminal;

a second ground-signal-ground (GSG) pad set comprising a second signal pad between two second ground pads, said second signal pad being electrically connected to one of said first terminal and said second terminal;

multiple direct current (DC) bias pads; and, multiple serial resistors, each serial resistor being electrically connected in series between one of said multiple direct current (DC) bias pads and one of said multiple terminals, said test structure being selectively operable in any one of a stress mode and an analysis mode, wherein, during said stress mode, said first signal pad receives an input radio frequency power signal and said second signal pad outputs an output radio frequency power signal.

2. The test structure of claim 1,
said second signal pad being electrically connected to said first terminal,
said integrated circuit device comprising a field effect transistor,
said multiple terminals further comprising a third terminal and a fourth terminal opposite said third terminal,
said first terminal comprising a drain, said second terminal comprising a source electrically connected to one of said two first ground pads and one of said two second ground pads, said third terminal comprising a gate and said fourth terminal comprising a body,
said multiple direct current (DC) bias pads comprising a first direct current (DC) bias pad and a second direct current (DC) bias pad,
said multiple serial resistors comprising a first serial resistor and a second serial resistor,
said first direct current (DC) bias pad and said first serial resistor being electrically connected in series to said gate, and
second direct current (DC) bias pad and said second serial resistor being electrically connected in series to said body,
wherein, during said stress mode, voltages at said first direct current (DC) bias pad and said second direct current (DC) bias pad are set such that said field effect transistor is in an off-state.

3. The test structure of claim 1,
said second signal pad being electrically connected to said first terminal,
said integrated circuit device comprising a field effect transistor,
said multiple terminals further comprising a third terminal and a fourth terminal opposite said third terminal,
said first terminal comprising a gate, said second terminal comprising a body, said third terminal comprising a source electrically connected to one of said two first ground pads and said fourth terminal comprising a drain electrically connected to one of said two second ground pads,
said multiple direct current (DC) bias pads comprising a first direct current (DC) bias pad and a second direct current (DC) bias pad,
said multiple serial resistors comprising a first serial resistor and a second serial resistor,
said first direct current (DC) bias pad and said first serial resistor being electrically connected in series to said gate, and
said second direct current (DC) bias pad and said second serial resistor being electrically connected in series to said body.

4. The test structure of claim 1,
said second signal pad being electrically connected to said first terminal,
said integrated circuit device comprising a resistor comprising a region of a substrate,
said first terminal and said second terminal being contacts to opposite ends of said resistor,
said multiple terminals further comprising a third terminal, said third terminal being a contact to said substrate,
said second terminal being electrically connected to one of said two first ground pads and one of said two second ground pads,
said multiple direct current (DC) bias pads comprising a first direct current (DC) bias pad and a second direct current (DC) bias pad,
said multiple serial resistors comprising a first serial resistor and a second serial resistor,
said first direct current (DC) bias pad and said first serial resistor being electrically connected in series to said first terminal, and
said second direct current (DC) bias pad and said second serial resistor being electrically connected in series to said third terminal.

5. The test structure of claim 1,
said second signal pad being electrically connected to said first terminal,
said integrated circuit device comprising a capacitor,
said first terminal comprising a first conductive plate, said second terminal comprising a second conductive plate, and at least one of said first conductive plate and said second conductive plate being a region of a substrate,
said multiple terminals further comprising a third terminal, said third terminal being a contact to said substrate,
said second conductive plate being electrically connected to one of said two first ground pads and one of said two second ground pads,
said multiple direct current (DC) bias pads comprising a first direct current (DC) bias pad and a second direct current (DC) bias pad,
said multiple serial resistors comprising a first serial resistor and a second serial resistor,
said first direct current (DC) bias pad and said first serial resistor being electrically connected in series to said first terminal, and
said second direct current (DC) bias pad and said second serial resistor being electrically connected in series to said third terminal.

6. The test structure of claim 1,
said second signal pad being electrically connected to said second terminal,
said integrated circuit device comprising a field effect transistor,
said multiple terminals further comprising a third terminal and a fourth terminal opposite said third terminal,
said first terminal comprising a drain, said second terminal comprising a source, said third terminal comprising a gate and said fourth terminal comprising a body,
said multiple direct current (DC) bias pads comprising a first direct current (DC) bias pad and a second direct current (DC) bias pad,
said multiple serial resistors comprising a first serial resistor and a second serial resistor,
said first direct current (DC) bias pad and said first serial resistor being electrically connected in series to said gate, and said second direct current (DC) bias pad and said second serial resistor being electrically connected in series to said body, wherein, during said stress mode, voltages at said first direct current (DC) bias pad and said second direct current (DC) bias pad are set such that said field effect transistor is in an on-state.

7. The test structure of claim 1,
said second signal pad being electrically connected to said second terminal,
said integrated circuit device comprising a resistor,
said first terminal and said second terminal being contacts to opposite ends of said resistor,
said multiple direct current (DC) bias pads comprising a first direct current (DC) bias pad and a second direct current (DC) bias pad,
said multiple serial resistors comprising a first serial resistor and a second serial resistor,
said first direct current (DC) bias pad and said first serial resistor being electrically connected in series to said first terminal, and
said second direct current (DC) bias pad and said second serial resistor being electrically connected in series to said second terminal.

8. The test structure of claim 1,
said second signal pad being electrically connected to said second terminal,
said integrated circuit device comprising a capacitor,
said first terminal comprising a first conductive plate,
said second terminal comprising a second conductive plate,
said multiple direct current (DC) bias pads comprising a first direct current (DC) bias pad and a second direct current (DC) bias pad,
said multiple serial resistors comprising a first serial resistor and a second serial resistor,
said first direct current (DC) bias pad and said first serial resistor being electrically connected in series to said first conductive plate, and
said second direct current (DC) bias pad and said second serial resistor being electrically connected in series to said second conductive plate.

9. A test system comprising:
a test structure comprising:
an integrated circuit device comprising multiple terminals comprising at least a first terminal and a second terminal opposite said first terminal;
a first ground-signal-ground (GSG) pad set comprising a first signal pad between two first ground pads, said first signal pad being electrically connected to said first terminal;
a second ground-signal-ground (GSG) pad set comprising a second signal pad between two second ground pads, said second signal pad being electrically connected to one of said first terminal and said second terminal;
multiple direct current (DC) bias pads; and,
multiple serial resistors, each serial resistor being electrically connected in series between one of said multiple direct current (DC) bias pads and one of said multiple terminals;
a radio frequency signal generator electrically connected to said test structure;
a network analyzer electrically connected to said test structure;
a direct current power supply electrically connected to said test structure;
a characterization tool; and
a controller controlling said radio frequency signal generator, said network analyzer, said characterization tool, and said direct current power supply in order to selectively operate said test structure in any one of a stress mode and an analysis mode, wherein, during said stress mode in order to subject said integrated circuit device to radio frequency power stress, a radio frequency open-circuit is established between at least one of said multiple terminals and said direct current power supply, said first signal pad receives an input radio frequency power signal from said radio frequency signal generator and said second signal pad outputs an output radio frequency power signal, and wherein, during said analysis mode, said network analyzer performs performance testing of said integrated circuit device and said characterization tool characterizes an impact of said radio frequency power stress on said integrated circuit device based on results of said performance testing.

10. The test system of claim 9,
said second signal pad being electrically connected to said first terminal,
said integrated circuit device comprising a field effect transistor,
said multiple terminals further comprising a third terminal and a fourth terminal opposite said third terminal,
said first terminal comprising a drain, said second terminal comprising a source electrically connected to one of said two first ground pads and one of said two second ground pads, said third terminal comprising a gate and said fourth terminal comprising a body,
said multiple direct current (DC) bias pads comprising a first direct current (DC) bias pad and a second direct current (DC) bias pad,
said multiple serial resistors comprising a first serial resistor and a second serial resistor,
said first direct current (DC) bias pad and said first serial resistor being electrically connected in series to said gate, and
second direct current (DC) bias pad and said second serial resistor being electrically connected in series to said body, wherein, during said stress mode, a first voltage from said direct current power supply at said first direct current (DC) bias pad and a second voltage from said direct current power supply at said second direct current (DC) bias pad are set such that said radio frequency open-circuit is established between said gate, said body and said direct current power supply and such that said field effect transistor is in an off-state, and wherein, during said analysis mode, said characterization tool characterizes an off-state hot carrier injection failure mechanism exhibited by said field effect transistor based on said results of said performance testing.

11. The test system of claim 9,
said second signal pad being electrically connected to said first terminal,
said integrated circuit device comprising a field effect transistor,
said multiple terminals further comprising, a third terminal and a fourth terminal opposite said third terminal,
said first terminal comprising a gate, said second terminal comprising a body, said third terminal comprising a source electrically connected to one of said two first ground pads and said fourth terminal comprising a drain electrically connected to one of said two second ground pads, said multiple direct current (DC) bias pads comprising a first direct current (DC) bias pad and a second direct current (DC) bias pad, said multiple serial resistors comprising a first serial resistor and a second serial resistor, said first direct current (DC) bias pad and said first serial resistor being electrically connected in series to said gate, and said second direct current (DC) bias pad and said second serial resistor being electrically connected in series to said body, wherein, during said stress mode, a first voltage from said direct current power supply at said first direct current (DC) bias pad and a second voltage from said direct current power supply at said second direct current (DC) bias pad are set such that said radio frequency open-circuit is established between said gate, said body and said direct current power supply, and wherein, during said analysis mode, said characterization tool characterizes a time-dependent dielectric breakdown failure mechanism exhibited by said field effect transistor.

12. The test system of claim 9, said second signal pad being electrically connected to said first terminal, said integrated circuit device comprising a resistor comprising a region of a substrate, said multiple terminals further comprising a third terminal, said first terminal and said second terminal being contacts at opposite ends of said resistor and said third terminal being a contact to said substrate, said second terminal being electrically connected to one of said two first ground pads and one of said two second ground pads, said multiple direct current (DC) bias pads comprising a first direct current (DC) bias pad and a second direct current (DC) bias pad, said multiple serial resistors comprising a first serial resistor and a second serial resistor, said first direct current (DC) bias pad and said first serial resistor being electrically connected in series to said first terminal, and said second direct current (DC) bias pad and said second serial resistor being electrically connected in series to said third terminal, wherein, during said stress mode, a voltage from said direct current power supply at said first direct current (DC) bias pad is set such that said radio frequency open-circuit is established between said first terminal and said direct current power supply, and wherein, during said stress mode, said resistor has an impedance value of greater than 250 ohm, thereby minimizing impedance mismatch impact.

13. The test system of claim 9, said second signal pad being electrically connected to said first terminal, said integrated circuit device comprising a capacitor, said multiple terminals further comprising a third terminal, said first terminal comprising a first conductive plate said second terminal comprising a second conductive plate, and at least one of said first conductive plate and said second conductive plate being a region of a substrate, said third terminal being a contact to said substrate, said second conductive plate being electrically connected to one of said two first ground pads and one of said two second ground pads, said multiple direct current (DC) bias pads comprising a first direct current (DC) bias pad and a second direct current (DC) bias pad, said multiple serial resistors comprising a first serial resistor and a second serial resistor, said first direct current (DC) bias pad and said first serial resistor being electrically connected in series to said first terminal, and said second direct current (DC) bias pad and said second serial resistor being electrically connected in series to said third terminal, wherein, during said stress mode, a voltage from said direct current power supply at said first direct current (DC) bias pad is set such that said radio frequency open-circuit being established between said first terminal and said direct current power supply, and wherein, during said stress mode, said capacitor has an impedance value of greater than 250 ohm, thereby minimizing impedance mismatch impact.

14. The test system of claim 9, said second signal pad being electrically connected to said second terminal, said integrated circuit device comprising a field effect transistor, said multiple terminals further comprising a third terminal and a fourth terminal opposite said third terminal, said first terminal comprising a drain, said second terminal comprising a source, said third terminal comprising a gate and said fourth terminal comprising a body, said multiple direct current (DC) bias pads comprising a first direct current (DC) bias pad and a second direct current (DC) bias pad, said multiple serial resistors comprising a first serial resistor and a second serial resistor, said first direct current (DC) bias pad and said first serial resistor being electrically connected in series to said gate, and said second direct current (DC) bias pad and said second serial resistor being electrically connected in series to said body, wherein, during said stress mode, a first voltage from said direct current power supply at said first direct current (DC) bias pad and a second voltage from said direct current power supply at said second direct current (DC) bias pad are set such that said radio frequency open-circuit is established between said gate, said body and said direct current power supply and such that said field effect transistor is in an on-state, and wherein, during said analysis mode, said characterization tool characterizes an on-state hot carrier injection failure mechanism exhibited by said field effect transistor.

15. The test system of claim 9, said second signal pad being electrically connected to said second terminal, said integrated circuit device comprising a resistor, said first terminal and said second terminal being contacts to opposite ends of said resistor, said multiple direct current (DC) bias pads comprising a first direct current (DC) bias pad and a second direct current (DC) bias pad, said multiple serial resistors comprising a first serial resistor and a second serial resistor, said first direct current (DC) bias pad and said first serial resistor being electrically connected in series to said first terminal, and said second direct current (DC) bias pad and said second serial resistor being electrically connected in series to said second terminal, wherein, during said stress mode, a first voltage from said direct current power at said first direct current (DC) bias pad and a second voltage from said direct current power supply at said second direct current (DC) bias pad are set such that said radio frequency open-circuit is established between said first terminal, said second terminal and said direct current power supply, and wherein, during said stress mode, said resistor has an impedance value of no greater than 10 ohms, thereby minimizing impedance mismatch impact.

16. The test system of claim 9, said second signal pad being electrically connected to said second terminal, said integrated circuit device comprising a capacitor, said first terminal comprising a first conductive plate, said second terminal comprising a second conductive plate, said multiple direct current (DC) bias pads comprising a first direct current (DC) bias pad and a second direct current (DC) bias pad, said multiple serial resistors comprising a first serial resistor and a second serial resistor, said first direct current (DC) bias pad and said first serial resistor being electrically connected in series between said direct current power supply and said first conductive plate, and said second direct current (DC) bias pad and said second serial resistor being electrically connected in series between said direct current power supply and said second conductive plate, wherein, during said stress mode, a first voltage from said direct current power at said first direct current (DC) bias pad and a second voltage from said direct current power supply at said second direct current (DC) bias pad are set such that said radio frequency open-circuit is established between said first terminal, said second terminal and said direct current power supply, and wherein, during said stress mode, said capacitor has an impedance value of no greater than 10 ohms, thereby minimizing impedance mismatch impact.

17. The test system of claim 9, further comprising:

a power meter;

a first directional coupler electrically connected to said radio frequency signal generator, said first signal pad and said power meter, said first directional coupler receiving said input radio frequency signal and applying said input radio frequency signal to said first signal pad and to said power meter; and a second directional coupler electrically connected to said second signal pad and said power meter, said second directional coupler receiving said output radio frequency signal from said second signal pad and applying said output radio frequency signal to said power meter, said power meter monitoring a difference between said input radio frequency power signal and said output radio frequency power signal during said stress mode to monitor path loss and impedance mismatch.

18. The test system of claim 17, further comprising a bias tee electrically connected in series between said radio frequency signal generator and said first directional coupler and further electrically connected to said direct current power supply, said bias tee allowing a direct current bias to also be applied to said first signal pad during said stress mode and analysis mode.

19. The test system of claim 17, further comprising a direct current block electrically connected in series between said radio frequency signal generator and said first directional coupler.

20. A test method comprising:

providing a test structure comprising:

an integrated circuit device comprising multiple terminals comprising at least a first terminal and a second terminal opposite said first terminal;

a first ground-signal-ground (GSG) pad set comprising a first signal pad between two first ground pads, said first signal pad being electrically connected to said first terminal;

a second ground-signal-ground (GSG) pad set comprising a second signal pad between two second ground pads, said second signal pad being electrically connected to one of said first terminal and said second terminal;

multiple direct current (DC) bias pads; and multiple serial resistors, each serial resistor being electrically connected in series between one of said multiple direct current (DC) bias pads and one of said multiple terminals; and, selectively operating said test structure in any one of a stress mode and an analysis mode, wherein, during said stress mode, in order to subject said integrated circuit device to radio frequency power stress, a radio frequency open-circuit is established between at least one of said multiple terminals and a direct current power supply, said first signal pad receives an input radio frequency power signal and said second signal pad outputs an output radio frequency power signal, and wherein, during said analysis mode, performance testing of said integrated circuit device is performed and, based on results of said performance testing, an impact of said radio frequency power stress on said integrated circuit device is characterized.

\* \* \* \* \*